US007746253B2

(12) United States Patent
Kitagawa et al.

(10) Patent No.: US 7,746,253 B2
(45) Date of Patent: Jun. 29, 2010

(54) SEMICONDUCTOR INTEGRATED CIRCUIT

(75) Inventors: Akira Kitagawa, Tokyo (JP); Akihiro Kitagawa, Tokyo (JP)

(73) Assignee: Renesas Technology Corp., Tokyo (JP)

( * ) Notice: Subject to any disclaimer, the term of this patent is extended or adjusted under 35 U.S.C. 154(b) by 25 days.

(21) Appl. No.: 12/277,465

(22) Filed: Nov. 25, 2008

(65) Prior Publication Data

US 2009/0140802 A1 Jun. 4, 2009

(30) Foreign Application Priority Data

Nov. 30, 2007 (JP) ............................ 2007-309955

(51) Int. Cl.
*H03M 1/00* (2006.01)
*H03M 1/12* (2006.01)

(52) U.S. Cl. ........................ 341/122; 341/155; 341/156

(58) Field of Classification Search ................ 341/122, 341/155, 156

See application file for complete search history.

(56) References Cited

U.S. PATENT DOCUMENTS

| | | | | |
|---|---|---|---|---|
| 6,806,745 | B2 * | 10/2004 | Fujimoto | 327/94 |
| 6,975,262 | B2 * | 12/2005 | Yada et al. | 341/154 |
| 7,154,426 | B2 * | 12/2006 | Tani et al. | 341/155 |
| 7,224,306 | B2 * | 5/2007 | Kobayashi | 341/155 |
| 7,277,038 | B2 * | 10/2007 | Yada et al. | 341/154 |
| 2006/0125676 | A1 * | 6/2006 | Kobayashi | 341/155 |
| 2006/0152400 | A1 * | 7/2006 | Yada et al. | 341/155 |
| 2006/0261997 | A1 * | 11/2006 | Chen | 341/155 |
| 2007/0164889 | A1 * | 7/2007 | Lee | 341/155 |
| 2007/0188367 | A1 * | 8/2007 | Yamada | 341/155 |

FOREIGN PATENT DOCUMENTS

| | | |
|---|---|---|
| JP | 2005-026805 A | 1/2005 |
| JP | 2007-104531 A | 4/2007 |

OTHER PUBLICATIONS

Richard C. Jaeger, "Tutorial: Analog Data Acquisition Technology Part III—Sample-and-holds, Instrumentation Amplifiers, and Analog Multiplexers", IEEE Micro, Nov. 1982, pp. 20-35.

(Continued)

*Primary Examiner*—Jean B Jeanglaude
(74) *Attorney, Agent, or Firm*—Miles & Stockbridge P.C.

(57) ABSTRACT

The present invention is directed to reduce offset error voltage in a signal source impedance of analog input signal voltage supplied to an input terminal due to input offset voltage of an operational amplifier in a sampling circuit or a multiplexer coupled to an input terminal of an A/D converter. A semiconductor integrated circuit has an A/D converter and a sampling circuit. The sampling circuit samples an analog input signal in first and second sample modes. The A/D converter converts the sampled analog signal to a digital signal in a conversion mode. By switching of an internal circuit of an operational amplifier between the first and second sample modes, the functions of a non-inverting input terminal (+) and an inverting input terminal (−) realized by first and second input terminals are switched. Synchronously with the switching, supply of an analog signal to the non-inverting input terminal by input switches is also switched.

18 Claims, 16 Drawing Sheets

OTHER PUBLICATIONS

Christian C. Enz et al., "Circuit Techniques for Reducing the Effects of OP-Amp Imperfections: Autozeroing, Correlated Double Sampling, and Chopper Stabilization", Proceedings of the IEEE, Vo. 84, No. 11, Nov. 1996, pp. 1584 to 1614.

Kenji Taniguchi, Semiconductor Series "CMOS analog circuit handbook for LSI designers" CQ Publisher, Aug. 1, 2006, The fourth Edition, pp. 127-132.

L. H. C. Ferreira et al. , "CMOS implementation of precise sample-and-hold circuit with self-correction of the offset voltage", IEE Proc.-Circuits Devices Syst, vol. 152, No. 5, Oct. 2005, pp. 451 to 455.

Vladimir Prodanov et al, "New CMOS Universal Constant-Gm Input Stage", 1998 IEEE International Conference on Electronics, Circuits and Systems, vol. 2, Sep. 7-10, 1998 pp. 359 to 362.

* cited by examiner

|  | T1 Smp | T2 ADC | T3 Smp | T4 ADC | T5 Smp | T6 ADC | T7 Smp | T8 ADC |
|---|---|---|---|---|---|---|---|---|
| AN0 | "1" | "0" | "0" | "0" | "1" | "0" | "0" | "0" |
| AN1 | "0" | "0" | "1" | "0" | "0" | "0" | "1" | "0" |
| Sw11, Sw12, Sw13, Sw14 | "1" | "1" | "1" | "0" | "0" | "0" | "0" | "0" |
| Sw21, Sw22, Sw23, Sw24 | "0" | "0" | "0" | "1" | "1" | "1" | "1" | "1" |
| SW01 | "1" | | | | "0" | "0" | "0" | "0" |
| SW02 | "0" | "1" | "1" | "1" | "1" | "0" | "0" | "0" |
| SW11 | "1" | "1" | "1" | "0" | "0" | "0" | "0" | "0" |
| SW12 | "1" | "1" | "0" | "0" | "0" | "0" | "1" | "0" |
| SW03 | "1" | "0" | "0" | "0" | "0" | "0" | "0" | "0" |
| SW04 | "0" | "0" | "0" | "0" | "1" | "0" | "0" | "0" |
| SW07 | "0" | "0" | "1" | "0" | "0" | "0" | "0" | "0" |
| SW08 | "0" | "0" | "0" | "0" | "0" | "0" | "1" | "0" |
| SW3 | ADCOM | VREF1 | ADCOM | VREF1 | ADCOM | VREF1 | ADCOM | VREF1 |

SEMICONDUCTOR INTEGRATED CIRCUIT

CLAIM OF PRIORITY

The Present application claims priority from Japanese application JP 2007-309955 filed on Nov. 30, 2007, the content of which is hereby incorporated by reference into this application.

FIELD OF THE INVENTION

The present invention relates to a semiconductor integrated circuit and, more particularly, to a technique useful to reduce offset error voltage in analog input signal source impedance due to input offset voltage of an operational amplifier in a sampling circuit or a multiplexer coupled to an input terminal of an A/D converter.

BACKGROUND OF THE INVENTION

In a system requested to have high precision and high resolution, as described in the following non-patent document 1, an analog multiplexer is used for selecting one of a plurality of analog input signals and supplying it to an A/D converter for converting an analog signal to a digital signal. A plurality of analog input signals are supplied to one end of a plurality of analog switches in the analog multiplexers. The other end of each of the plural analog switches is coupled to an input terminal of a buffer amplifier. An output of the buffer amplifier is coupled to an input terminal of the A/D converter via a sample and hold circuit. The basic function of the sample and hold circuit in an analog input system is to capture an input signal and hold it constant in the following conversion cycle of the A/D converter.

The sample and hold circuit is configured by an input buffer amplifier, a sample and hold switch, a retention capacitor, and an output buffer. In a sample mode, an input signal is retained in the retention capacitor via the input buffer amplifier and the sample and hold switch in the on state. In a hold mode, the sample and hold switch is controlled in an off state, and the retained voltage in the retention capacitor is supplied to the input terminal of the A/D converter via the output buffer.

In the following patent document 1, a semiconductor integrated circuit in which an analog multiplexer and a successive-approximation-type A/D converter are formed on a semiconductor substrate is described. The analog multiplexer selects a plurality of analog input signals of a plurality of external terminals, and the selected analog input signal is supplied to a first input terminal of a comparator in the successive-approximation-type A/D converter. A plurality of bit signals of a successive-approximation register are controlled by an output of the comparator, and a local D/A converter is controlled by the plural bit signals of the successive-approximation register. In response to upper eight bit signals and lower two bit signals in the plural bit signals from the successive-approximation register, first and second comparison reference voltages are generated, respectively, from the local D/A converter. The first and second comparison reference voltages from the local D/A converter are supplied to second and third input terminals of the comparator via first and second operational amplifiers, respectively. Two input terminals of a selection switch are coupled to the first and second input terminals, an output terminal of the selection switch is coupled to one end of a first capacitor, one end of a second capacitor is coupled to the third input terminal, and the other end of the first capacitor and the other end of the second capacitor are coupled to an input terminal of a voltage comparator. In the local D/A converter, a first transfer switch for reducing the influence of the offset voltage of the first operational amplifier is coupled between the input and output terminals of the first operational amplifier. A second transfer switch for reducing the influence of the offset voltage of the second operational amplifier is coupled between the input and output terminals of the second operational amplifier.

On the other hand, the following non-patent document 2 describes a circuit technique for reducing the influence of incompleteness of an operational amplifier using correlated double sampling (CDS). FIG. 29 of the non-patent document 2 shows a switched-capacitor-type sample and hold circuit of a first format configured by a first switch, a second switch, a sampling capacitor, an operational amplifier, and a third switch. An input signal is supplied to one end of the sampling capacitor via the first switch controlled by a first clock signal and one end of the second switch controlled by a second clock signal. The other end of the sampling capacitor is coupled to an inverting input terminal of the operational amplifier and one end of the third switch controlled by the first clock signal. A non-inverting input terminal of the operational amplifier is coupled to the grounding potential, and an output terminal of the operational amplifier is coupled to the other end of the second switch and the other end of the third switch.

The switched-capacitor-type sample and hold circuit of the first format executes operations in a sample mode and a hold mode as described below. Specifically, in a period in which the first clock signal is at the high level, an input signal is supplied to the inverting input terminal of the operational amplifier via the sampling capacitor. Since the inverting input terminal and the output terminal of the operational amplifier are coupled to each other, the difference voltage between the input signal voltage and the offset voltage is sampled between both ends of the sampling capacitor. In the high-level period of the second clock signal, an input signal supply node is opened from the inverting input terminal of the operational amplifier, and the sampling capacitor is coupled between the inverting input terminal and the output terminal of the operational amplifier. Therefore, a hold output signal in which the influence of the offset voltage is reduced by the correlated double sampling is obtained.

The following non-patent document 3 describes a switched-capacitor-type comparator using correlated double sampling (CDS). The switched-capacitor-type comparator includes a selection first switch having two input terminals, a sampling capacitor, an operational amplifier, and a second switch. The switched-capacitor-type comparator executes operations in a sample mode and a hold and voltage comparison mode as follows. Specifically, in the sample mode, an input signal is supplied to an inverting input terminal of the operational amplifier via a first input terminal of the selection first switch and the sampling capacitor. Since the inverting input terminal and the output terminal of the operational amplifier are coupled to each other, the difference voltage between the input signal voltage and the offset voltage is sampled between both ends of the sampling capacitor. In the hold and voltage comparison mode, the ground voltage is supplied to the inverting input terminal of the operational amplifier via the second input terminal of the selection first switch and the sampling capacitor, and the inverting input terminal of the operational amplifier and the output terminal are opened. Therefore, the offset voltage of the operational amplifier is cancelled between the operations of the sampling mode and the hold and voltage comparison mode. According to the positive/negative sign of a negative input signal voltage −Vin corresponding to the difference between the offset voltage and the input signal voltage, a logic determination result is obtained from the output terminal of the operational amplifier.

On the other hand, the non-patent document 4 describes a switched-capacitor-type sample and hold circuit of the second format different from that of the first format described in the non-patent document 2. The switched-capacitor-type sample and hold circuit of the second format is configured by three current sources which can form an operational amplifier, a differential pair P-channel MOS transistor, two load N-channel MOS transistors, two grounded-source amplification N-channel MOS transistors, seven switches, and a load capacitor.

In the sample mode of the switched-capacitor-type sample and hold circuit of the second format, an input signal is supplied to the non-inverting input terminal of the operational amplifier, and an output terminal of the operational amplifier is coupled to the load capacitor and the inverting input terminal. Therefore, the operational amplifier in the sample mode operates with a unity gain (voltage follower), so that the level of the input signal of the non-inverting input terminal is sampled in the load capacitor of the output terminal. In the hold mode, the load capacity is supplied to the non-inverting input terminal of the operational amplifier, and the output terminal of the operational amplifier is coupled to the output and the inverting input terminal. Therefore, since the operational amplifier operates at the unity gain (voltage follower) also in the hold mode, the sample level of the load capacitor of the non-inverting input terminal is held at the output. The transistors functioning as the non-inverting input terminal and the inverting input terminal of the operational amplifier in the sample mode and the hold mode, respectively, are switched between the right and left P-channel MOS transistors in the differential pair. Further, transistors functioning as an input transistor and an output transistor in the current mirror of two load N-channel MOS transistors in the operational amplifier are switched between the right and left N-channel MOS transistors in the sample mode and the hold mode. The transistors functioning as output elements of the operational amplifiers in the sample mode and the hold mode are switched between right and left two grounded-source amplification N-channel MOS transistors. By the switch between the right and left transistors, the influence of the offset voltage due to mismatch of transistors configuring the operational amplifier can be reduced.

The following patent document 2 describes that, to reduce the influence on an A/D conversion result of the offset voltage of an amplifier in a special cyclic A/D converter, a change-over switch for switching two feedback capacitors between a differential input and a differential output of the amplifier between cross-couple connection and straight connection is used.

On the other hand, the following non-patent document 5 describes a gm control circuit for making mutual conductance "gm" of a rail-to-rail input circuit constant. The rail-to-rail input circuit includes an N-channel differential MOS transistor and a P-channel differential MOS transistor which are coupled in parallel against a change in common-mode input voltage. The gm control circuit includes a current switch P-channel MOS, a current switch N-channel MOS, a current mirror N-channel MOS, and a current mirror P-channel MOS.

A pair of P-channel MOS transistors generate a high-level common-mode voltage from a differential input signal. The high-level common-mode voltage is supplied to the source of the current switch P-channel MOS having a gate to which DC bias voltage is supplied. By the current mirror N-channel MOS coupled to the drain of the current switch P-channel MOS, the bias current of the source of the N-channel differential MOS transistor is controlled in proportional to the drain current of the current switch P-channel MOS. The pair of N-channel MOS transistors generate low-level common-mode voltage from the differential input signal, and the low-level common-mode voltage is supplied to the source of the current switch N-channel MOS having a gate to which the DC bias voltage is supplied. By the current mirror P-channel MOS coupled to the drain of the current switch N-channel MOS, the bias current of the source of the P-channel differential MOS transistor is controlled in proportional to the drain current of the current switch N-channel MOS.

[Non-patent document 1] Richard C. Jaeger, "Tutorial; Analog Data Acquisition Technology Part III—Sample-and-holds, Instrumentation Amplifiers, and Analog Multiplexers", IEEE MICRO, November 1982, pp. 20 to 35

[Non-patent document 2] Christian C. Enz et al, "Circuit Techniques for Reducing the Effects of Op-Amp Imperfections: Autozeroing, Correlated Double Sampling, and Chopper Sabilization", PROCEEDINGS OF THE IEEE, VOL. 84, NO. 11, NOVEMBER 1996, PP. 1584 to 1614

[Non-patent document 3] Kenji Taniguchi, Semiconductor Series "CMOS analog circuit handbook for LSI designers", CQ Publisher, Aug. 1, 2006, The fourth Edition, pp. 127 to 132

[Non-patent document 4] L. H. C. Ferreira et al, "CMOS implementation of precise sample-and-hold circuit with self-correction of the offset voltage", IEE Proc.—Circuits Devices Syst, VOL. 152, NO. 5, OCTOBER 2005, PP. 451 to 455

[Non-patent document 5] Vladimir I. Prodanov et al, "New CMOS Universal Constant-Gm Input Stage", 1998 IEEE International Conference on Electronics, Circuits and Systems, Vol. 2 7-10 Sep. 1998 pp. 359 to 362

[Patent document 1] Japanese Unexamined Patent Publication No. 2005-026805

[Patent document 2] Japanese Unexamined Patent Publication No. 2007-104531

SUMMARY OF THE INVENTION

Prior to the present invention, the inventors of the present invention were engaged in development of a microcomputer mounted on a vehicle. An in-vehicle microcomputer includes an analog multiplexer and a successive-approximation-type A/D converter on a semiconductor substrate of a semiconductor integrated circuit as described in the patent document 1.

Prior to the development, the inventors of the present invention examined various comparators and sample and hold circuits described in the background of the invention.

First, using the sample and hold circuit of the first format using correlated double sampling described in the non-patent document 2, in a state where the inverting input terminal and the output terminal of the operational amplifier are coupled, the input signal is sampled in the sampling capacitor coupled to the inverting input terminal of the operational amplifier. After that, in a state where the inverting input terminal and the output terminal of the operational amplifier are open, comparison reference voltage is supplied to the sampling capacitor coupled to the inverting input terminal of the operational amplifier. As a result, operations similar to those in the sample mode and the hold and voltage comparison mode of the switched-capacitor-type comparator using correlated double sampling described in the non-patent document 3 can be realized. The offset voltage of the operational amplifier is cancelled and, according to the positive/negative sign of the differential voltage between the comparison reference voltage and the input signal voltage, a logic determination result is obtained from the output terminal of the operational amplifier.

In the switched-capacitor-type sample and hold circuit of the second format described in the non-patent document 4, the influence of the offset voltage due to mismatch of the transistors configuring the operational amplifier at the time of switch between the right and left transistors can be reduced. However, in the switched-capacitor-type sample and hold circuit of the second format, operations similar to those of the hold and voltage comparison mode of the switched-capacitor-type comparator described in the non-patent document 3 like the sample and hold circuit of the first format described in the non-patent document 2 cannot be realized.

Further, the cyclic A/D converter described in the patent document 2 can reduce the influence on an A/D conversion result of the offset voltage of the internal amplifier by switching between the cross-couple connection and the straight connection of two feedback capacitors between the differential input and the differential output of the amplifier. However, the cyclic A/D converter is an extremely special A/D converter, so that it cannot be applied to the successive-approximation-type A/D converter as described in the patent document 1.

FIG. 1 is a diagram showing a monolithic semiconductor integrated circuit examined by the inventors of the present invention prior to the present invention. The monolithic semiconductor integrated circuit is, as described in the patent document 1, an in-vehicle microcomputer including an analog multiplexer and a successive-approximation-type A/D converter on a semiconductor substrate of a semiconductor integrated circuit.

As shown in the diagram, a semiconductor chip of a semiconductor integrated circuit includes an analog circuit part Analog_Cir, a digital circuit part Digital_Cir, and a central processing unit (CPU, not shown).

The analog circuit part Analog_Cir includes eight-channel analog input terminals AN0, AN1, AN2, and AN7, a one-channel analog-output multiplexer MPX, and a 10-bit successive-approximation-type A/D converter 10-bit A/D_Conv. The analog circuit part Analog_Cir also includes a 10-bit local D/A converter 10-bit local D/A_Conv.

The digital circuit part Digital_Cir includes a control circuit Control_Cir. The control circuit Control_Cir is controlled by the 10-bit successive-approximation-type A/D converter 10-bit A/D_Conv, and controls the 10-bit local D/A converter 10-bit local D/A_Conv via a local D/A converter register Local D/A Reg. To the control circuit Control_Cir, four data registers Data Reg A, B, C, and D, a status register Status Reg, and a control register Control Reg are coupled. To the four data registers Data Reg A, B, C, and D, the status register Status Reg, and the control register Control Reg, a bus interface Bus_Int is coupled via a module data bus Mod_Data_Bus. To the bus interface Bus_Int, an internal data bus Int_Data_Bus is also coupled. Although not shown, the bus interface Bus_Int is coupled to the central processing unit (CPU) via a peripheral bus and a bus switch controller.

The local D/A converter 10-bit Local D/A_Conv in the analog circuit part Analog_Cir includes 257 resistors R0, R1, . . . , R127, R128, R129, R130, R131, . . . , R255, and R256 coupled in series. The 10-bit local D/A converter 10-bit Local D/A_Conv includes 256 higher-bit switches controlled by a higher 8-bit decoder 8-bit DEC and four lower-bit switches controlled by a lower 2-bit decoder 2-bit DEC.

A higher-bit reference voltage $V_{REF1}$ selected by the 256 higher-bit switches of the 10-bit local D/A converter 10-bit local D/A_Conv is supplied to a sampling capacitor C1 of the input of a comparator Comp of the 10-bit successive-approximation-type A/D converter 10-bit A/D_Conv via an operational amplifier OP1. A lower-bit reference voltage $V_{REF2}$ selected by the four lower-bit switches of the 10-bit local D/A converter 10-bit local D/A_Conv is supplied to another sampling capacitor C4 of the input of a comparator Comp of the 10-bit successive-approximation-type A/D converter 10-bit A/D_Conv via an operational amplifier OP2. As described in the patent document 1, transfer switches SW1 and SW2 for reducing the influence of the offset voltage are coupled between the non-inverting input terminal and the output terminal of each of the operational amplifiers OP1 and OP2.

First, the operational amplifiers OP1 and OP2 are activated, and the transfer switches SW1 and SW2 are controlled in the off state. After that, while the operational amplifiers OP1 and OP2 are made inactive, the transfer switches SW1 and SW2 are controlled in the on state, and the higher-bit reference voltage $V_{REF1}$ and lower-bit reference voltage $V_{REF2}$ in which the influence of the offset voltages of the operational amplifiers OP1 and OP2 is reduced can be generated.

The A/D converting operation of the 10-bit successive-approximation-type A/D converter 10-bit A/D_Conv is executed as follows.

First, in the sample mode, analog input signal voltage of the input terminal of any of the analog input terminals AN0, AN1, AN2, . . . , and AN7 of eight channels is selected by the multiplexer MPX, and the selected analog input signal voltage is output to the analog output terminal ADCOM of one channel. The selected analog input signal voltage of the analog output terminal ADCOM is supplied to one end of the sampling capacitor Cl via a switch SW3. At this time, the non-inverting input terminal + of the operational amplifier in the comparator Comp is coupled to the ground voltage GND, and a switch SW4 between the inverting input terminal – and the output terminal of the operational amplifier is controlled in the on state, so that the inverting input terminal – is set to virtual ground potential. Therefore, since the other end of the sampling capacitor C1 is also at the virtual grounding potential, the selected analog input signal voltage of the analog output terminal ADCOM is applied across the sampling capacitor C1.

In the conversion mode, the switch SW4 between the inverting input terminal – and the output terminal of the operational amplifier is controlled in the off state, the high-order bit reference voltage $V_{REF1}$ of the operational amplifier OP1 is supplied to one end of the sampling capacitor C1 via the switch SW3, and the low-order bit reference voltage $V_{REF2}$ of the operational amplifier OP2 is supplied to one end of the capacitor C4. According to the positive/negative sign of the differential voltage between addition reference voltage of the higher-order bits and the lower-order bits and the selected analog input signal voltage, a logic determination result is obtained from the output terminal of the operational amplifier of the comparator Comp.

During the operations in the sample mode and the conversion mode, as described in the non-patent document 2, the influence of the offset voltage of the operational amplifier as a component of the comparator Comp of the 10-bit successive-approximation-type A/D converter 10-bit A/D_Conv can be reduced by the correlated double sampling.

In response to the logic determination result of the comparator Comp, the control circuit Control_Cir updates the data retained in the local D/A conversion register Local D/A Reg in accordance with a predetermined search algorithm such as binary search. Specifically, whether the selected analog input signal voltage is higher than the half of the analog input dynamic range of the 10-bit successive-approximation-type A/D converter 10-bit A/D_Conv or not is determined. After that, on the basis of the determination result, whether the next criterion is set to ¾ of the dynamic range or ¼ of the dynamic range is determined. The next criterion is determined by the high-order bit reference voltage $V_{REF1}$ and the low-order bit reference voltage $V_{REF2}$ from the 10-bit local D/A converter 10-bit Local D/A_Conv responding to the updated data retained in the local D/A converter register Local D/A Reg.

For example, by repeating the determination according to the predetermined search algorithm such as binary search, the data retained in the local D/A converter register Local D/A Reg is converged to a 10-bit A/D conversion result of the selected analog input signal voltage.

FIG. 2 is a diagram showing an internal configuration of a multiplexer MPX in the monolithic semiconductor integrated circuit examined by the inventors of the present invention prior to the present invention shown in FIG. 1 and external circuits coupled to the analog input terminals AN0, AN1, . . . , and AN7 of the multiplexer MPX. The external circuits are configured by in-vehicle parts mounted on a vehicle.

In FIG. 2, eight various in-vehicle sensors Sen0, Sen1, . . . , and Sen7 are coupled to the analog input terminals AN0, AN1, . . . , and AN7 of the multiplexer MPX via resistors Rin0, Rin1, . . . , and Rin7 and capacitors Cin0, Cin1, . . . , and Cin7, respectively. To one end of each of the in-vehicle sensors Sen0, Sen1, . . . , and Sen7, battery voltage of the vehicle is supplied. The other ends of the in-vehicle sensors Sen0, Sen1, . . . , and Sen7 are coupled to the resistors Rin0, Rin1, . . . , and Rin7. The resistors Rin0 to Rin7 of the analog input terminals AN0 to AN7 of the multiplexer MPX are provided to prevent the battery voltage (12 volts) of the vehicle from being directly supplied to the analog input terminals AN0 to AN7 of the multiplexer due to a failure in the in-vehicle sensors Sen0 to Sen7, and have a resistance value of 20 KΩ. The capacitors Cin0 to Cin7 coupled to the resistors Rin0 to Rin7 are provided to absorb surge voltage pulses from the in-vehicle sensors Sen0 to Sen7 and have a capacitance value of about 0.1 microfarad.

As shown in FIG. 2, the channels of the multiplexer MPX are configured by operational amplifiers OpAmp0 to OpAmp7, first switches SW01 to SW71, and second switches SW02 to SW72, respectively. The non-inverting input terminals + of the operational amplifiers OpAmp0 to OpAmp7 are coupled to the analog input terminals AN0 to AN7 of the multiplexer MPX. Since the inverting input terminals – of the operational amplifiers OpAmp0 to OpAmp7 and the output terminal are directly coupled, each of the operational amplifiers OpAmp0 to OpAmp7 is configured as a voltage follower (unity gain amplifier) The output terminals of the operational amplifiers OpAmp0 to OpAmp7 are coupled to one of the input terminals of the switch SW3 of the 10-bit successive-approximation-type A/D converter 10-bit A/D_Conv via the first switches SW01 to SW71. In the selection sampling mode, in response to a 3-bit selection control signal supplied to the multiplexer MPX, the analog input signal voltage of the input terminal of any of the analog input terminals AN0 to AN7 of eight channels is selected. The selected analog input signal voltage is output to the analog output terminal ADCOM of one channel.

FIG. 3 is a diagram for explaining the operation of selecting an analog input signal in the selection sampling mode of the multiplexer MPX shown in FIG. 2. In the selection sampling mode, the multiplexer MPX sequentially and periodically samples the analog input signal voltages of the analog input terminals AN0 to AN7 of eight channels in a time-division manner.

As shown in FIG. 3, in the first half of the sampling period of the analog input terminal AN0 of the zero channel, first, the first switch SW01 is controlled to the on state. Therefore, the analog input signal voltage of the analog input terminal AN0 of the zero channel in the multiplexer MPX is output to the analog output terminal ADCOM of the multiplexer MPX via the voltage follower configured by the operational amplifier OpAmp0 and the first switch SW01. At this time, by the high-output driving capability of the voltage follower of the analog output terminal ADCOM of the multiplexer MPX, the voltage level of the analog output terminal ADCOM follows the analog input signal voltage level of the analog input terminal AN0 at high speed.

In the latter half of the sampling period of the analog input terminal AN0 of the zero channel, the first switch SW01 is controlled to the off state and, after that, the second switch SW02 is controlled to the on state. Therefore, the analog input signal voltage of the analog input terminal AN0 of the zero channel in the multiplexer MPX is output to the analog output terminal ADCOM of the multiplexer MPX via the second switch SW02 while bypassing the voltage follower configured by the operational amplifier OpAmp0 and the first switch SW01. As a result, even if the input offset voltage exists between the non-inverting input terminal + and the inverting input terminal – of the operational amplifier OpAmp0 of the voltage follower, by the bypass function of the second switch SW02, the influence of the input offset voltage to the voltage level of the analog output terminal ADCOM can be reduced.

FIG. 4 is a diagram for explaining the operation of repeating: the operation of selecting the analog input signal in the selection sampling mode of the multiplexer MPX in FIG. 2 and the A/D converting operation of the analog input signal in the converting mode by the 10-bit successive-approximation-type A/D converter 10-bit A/D_Conv in FIG. 2. In the repetitive selection sampling mode, the multiplexer MPX samples sequentially and periodically the analog input signal voltages of the analog input terminals AN0 to AN7 of eight channels in a time division manner. In the repetitive conversion mode, the 10-bit successive-approximation-type A/D converter 10-bit A/D_Conv converts the analog input signal voltage sampled just before that by the multiplexer MPX to a digital signal. In such a manner, the 10-bit successive-approximation-type A/D converter 10-bit A/D_Conv sequentially converts the analog input signal voltages of the analog input terminals AN0 to AN7 of eight channels to digital signals.

However, the inventors of the present invention clarified the problem such that a sampling error occurs in the analog input terminals AN0 to AN7 in the selection sampling mode of the analog input terminals AN0 to AN7 of eight channels by the multiplexer MPX shown in FIG. 2 examined prior to the present invention. The inventors of the present invention examined the mechanism of occurrence of the sampling error in the analog input terminals and, as a result, clarified the following error occurrence mechanism.

It is now assumed that each of the analog input signal voltages of the analog input terminals AN0 to AN7 of eight channels is maintained stably as constant DC voltage. However, as described above, the voltage level of the analog output terminal ADCOM includes the influence of the input offset voltage of the operational amplifier OpAmp0 of the voltage follower in the first half of the sampling period of the analog input terminal of each channel. The voltage level of the analog output terminal ADCOM in the latter half of the sampling period of the analog input terminal of each channel is obtained by reducing the influence of the input offset voltage of the operational amplifier OpAmp0 of the voltage follower by the bypass function of the second switch SW02. By repeating the operation in the first half and the operation in the latter half in the sampling period of the analog input terminal in a state where the analog input signal voltages of the analog input terminals are maintained stably at predetermined DC voltage, charges of Q=C·Voff are consumed. C denotes a capacitance value of output parasitic capacitance Cp of the analog output terminal ADCOM of the multiplexer MPX. Voff denotes the value of input offset voltage of each of the operational amplifiers OpAmp0 to OpAmp7 of the analog input terminals AN0 to AN7 of the multiplexer MPX. When sampling repetition frequency of the analog input terminals AN0 to AN7 of eight channels of the multiplexer MPX is expressed as "f", current of i=ΔQ/ΔT=f·C·Voff flows in each of the analog input terminals.

As a result, in the resistors Rin0 to Rin7 of the analog input terminals AN0 to AN7 of the multiplexer MPX, a sampling error voltage of Vso=R·f·C·Voff is generated. R denotes a resistance value of the resistors Rin0 to Rin7 of the analog input terminals AN0 to AN7. For example, when the resistance R is 20 KΩ, the sampling repetition frequency "f" is 1 MHz, output parasitic capacitance C is 23 pF, and input offset voltage Voff is 10 mV, the sampling error voltage Vso is almost 4.6 mV.

The sampling error voltage Vso of about 4.6 mV generated across the resistors Rin0 to Rin7 of the analog input terminals AN0 to AN7 of eight channels of the multiplexer MPX is stationary offset error voltage to the analog input signal voltages of the analog input terminals AN0 to AN7 of the multiplexer MPX.

The present invention has been achieved on the basis of the result of the examination of the inventors of the present invention prior to the present invention.

Therefore, an object of the present invention is to reduce offset error voltage at signal source impedance in analog input signal voltage supplied to an input terminal due to input offset voltage of an operational amplifier as a component of a sapling circuit or a multiplexer coupled to an input terminal of an A/D converter.

The above and other objects of the present invention and novel features will become apparent from the description of the specification and the appended drawings.

A representative one of the inventions disclosed in the application will be briefly described as follows.

A representative semiconductor integrated circuit of the present invention includes an A/D converter (10-bit A/D_Conv) and a sampling circuit (MPX) coupled to an input terminal of the A/D converter (refer to FIGS. 1 and 5).

The sampling circuit samples an analog input signal supplied to the analog input terminal in a first sample mode (Smp_Md1) and a second sample mode (Smp_Md2) (refer to FIGS. 7 and 8).

The A/D converter converts an analog signal sampled by the sampling circuit to a digital signal in a conversion mode.

In the first and second sample modes, by switching of the internal circuit of the operational amplifier OpAmp0, the functions of the non-inverting input terminal (+) and the inverting input terminal (−) by the first and second input terminals (In1 and In2) change. Synchronously with the function switch, supply to the non-inverting input terminal (+) of the analog signal by the input switches (SW01 and SW02) is also switched.

As a result, the polarity of the sampling error voltage at the signal source impedance of the analog input terminal of the sampling circuit due to the input offset voltage between the first and second input terminals of the operational amplifier changes between the first and second sample modes. Therefore, the average voltage level obtained by time integration of the sampling error voltage whose polarity changes becomes almost zero, so that the offset error voltage at the signal source impedance can be reduced.

The effect obtained by representative one of the inventions disclosed in the application will be briefly described as follows.

The present invention can produce offset error voltage at signal source impedance in analog input signal voltage supplied to an input terminal due to input offset voltage of an operational amplifier as a component of a sapling circuit or a multiplexer coupled to an input terminal of an A/D converter.

DETAILED DESCRIPTION OF THE PREFERRED EMBODIMENTS

Representative Embodiments

Figure 1:
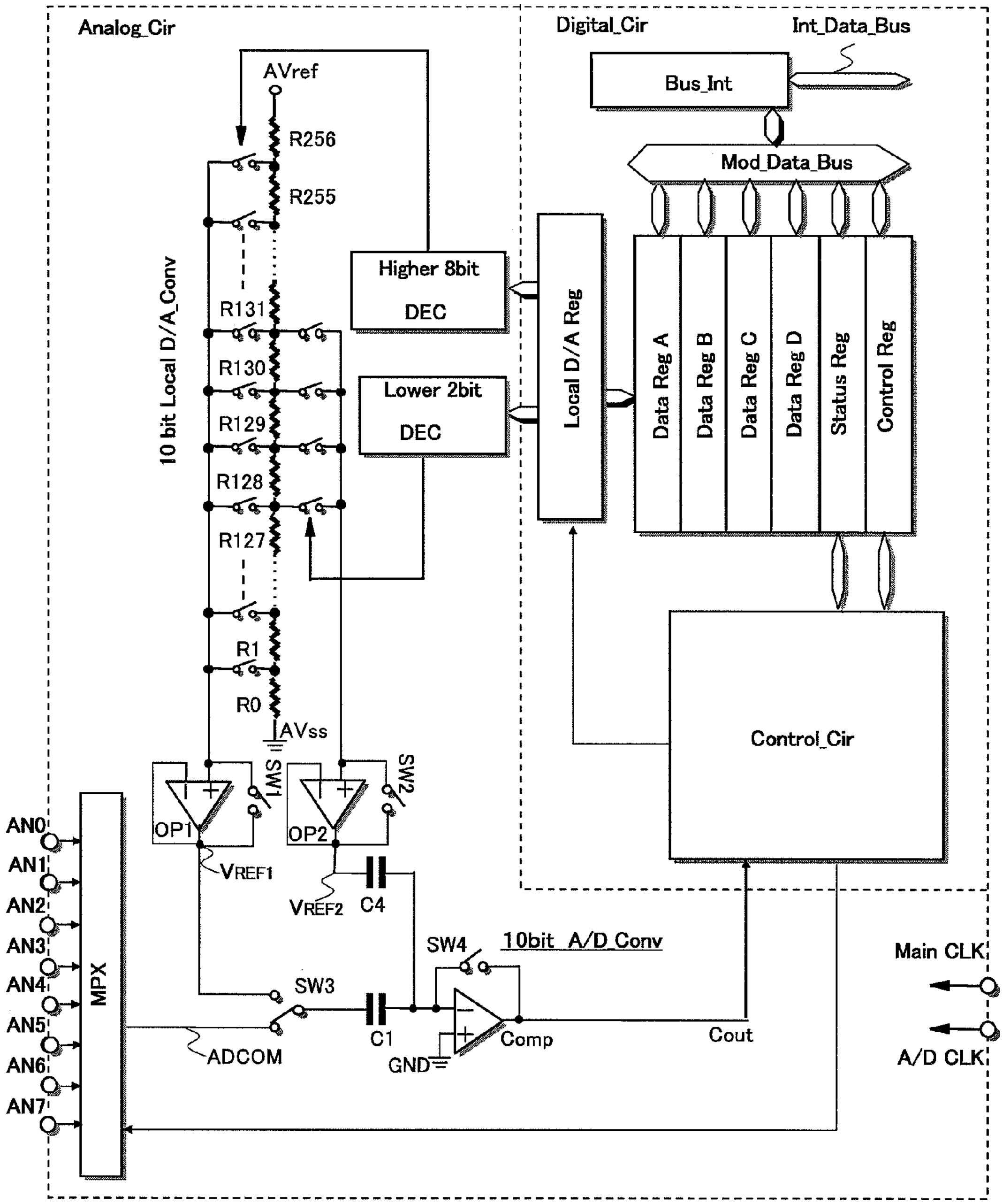
FIG. 1 is a diagram showing a monolithic semiconductor integrated circuit examined by the inventors of the present invention prior to the present invention and as an embodiment of the present invention.

First, outline of representative embodiments of the present invention disclosed in the application will be described. Reference numerals in the diagrams referred to in the description of the outline in parenthesis with respect to the representative embodiments simply denote concept of components.

[1]. A semiconductor integrated circuit as a representative embodiment of the present invention has an A/D converter (10-bit A/D_Conv) and a sampling circuit (MPX) coupled to an input terminal of the A/D converter (refer to FIGS. 1 and 5).

The sampling circuit includes an analog input terminal (AN0), an operational amplifier (OpAmp0), a first switch (SW01), a second switch (SW02), a third switch (SW03), a fourth switch (SW04), a fifth switch (SW05), and an analog output terminal (ADCOM).

The analog input terminal is coupled to one end of the first switch and one end of the second switch, and the other end of the first switch and the other end of the second switch are coupled to a first input terminal (In1) and a second input terminal (In2), respectively, of the operational amplifier.

One end and the other end of the third switch are coupled to the first input terminal of the operational amplifier and an output terminal of the operational amplifier, respectively, and one end and the other end of the fourth switch are coupled to the first input terminal of the operational amplifier and the output terminal of the operational amplifier, respectively.

An output terminal of the operational amplifier is coupled to an input terminal of the A/D converter via the analog output terminal.

Figure 5:
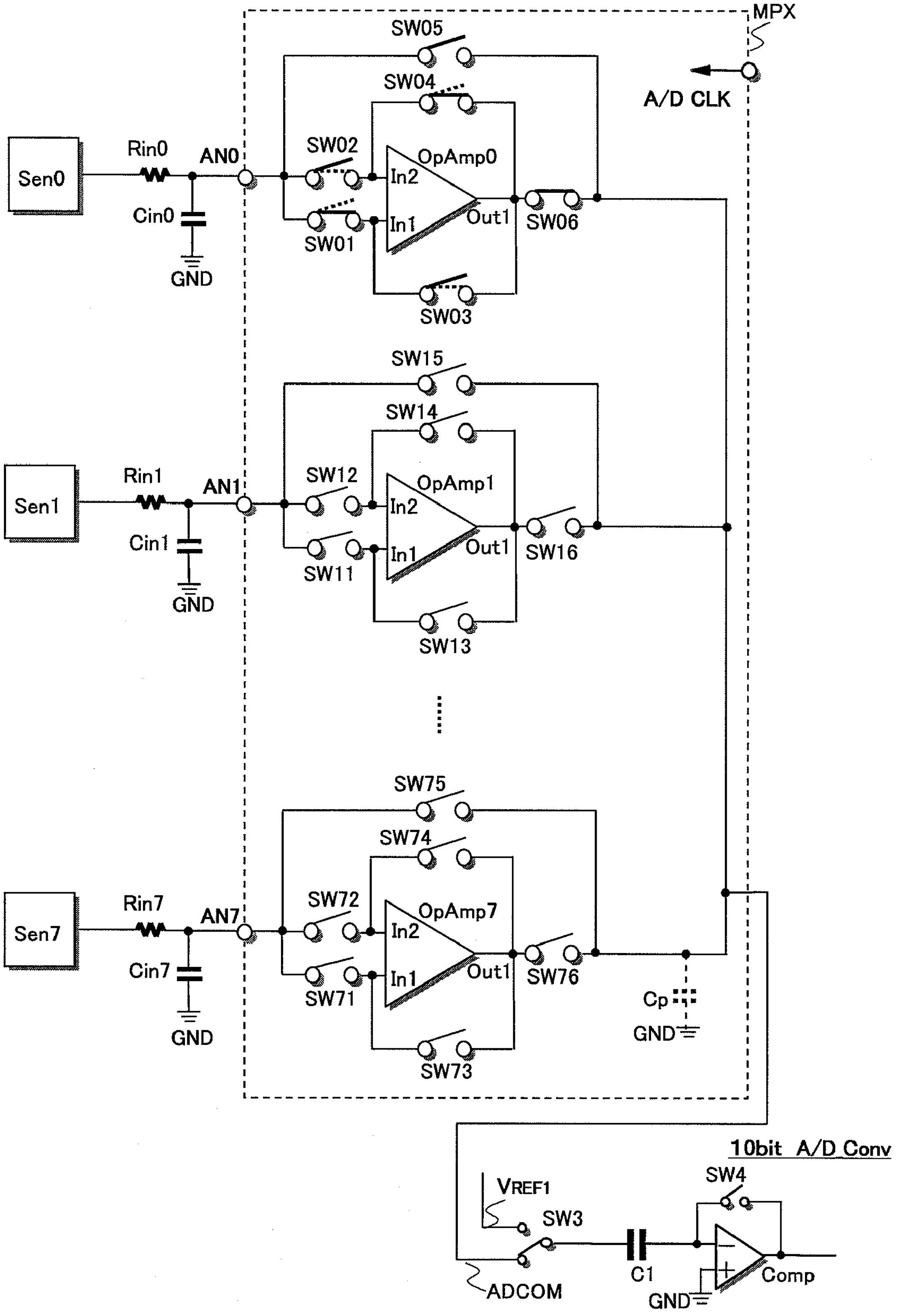
FIG. 5 is a diagram showing an internal configuration of a multiplexer in a monolithic semiconductor integrated circuit and external circuits coupled to analog input terminals of the multiplexer as an embodiment of the present invention shown in FIG. 1.

One end and the other end of the fifth switch are coupled to the analog input terminal and the analog output terminal, respectively, so as to bypass the operational amplifier (refer to FIG. 5).

Figure 7:
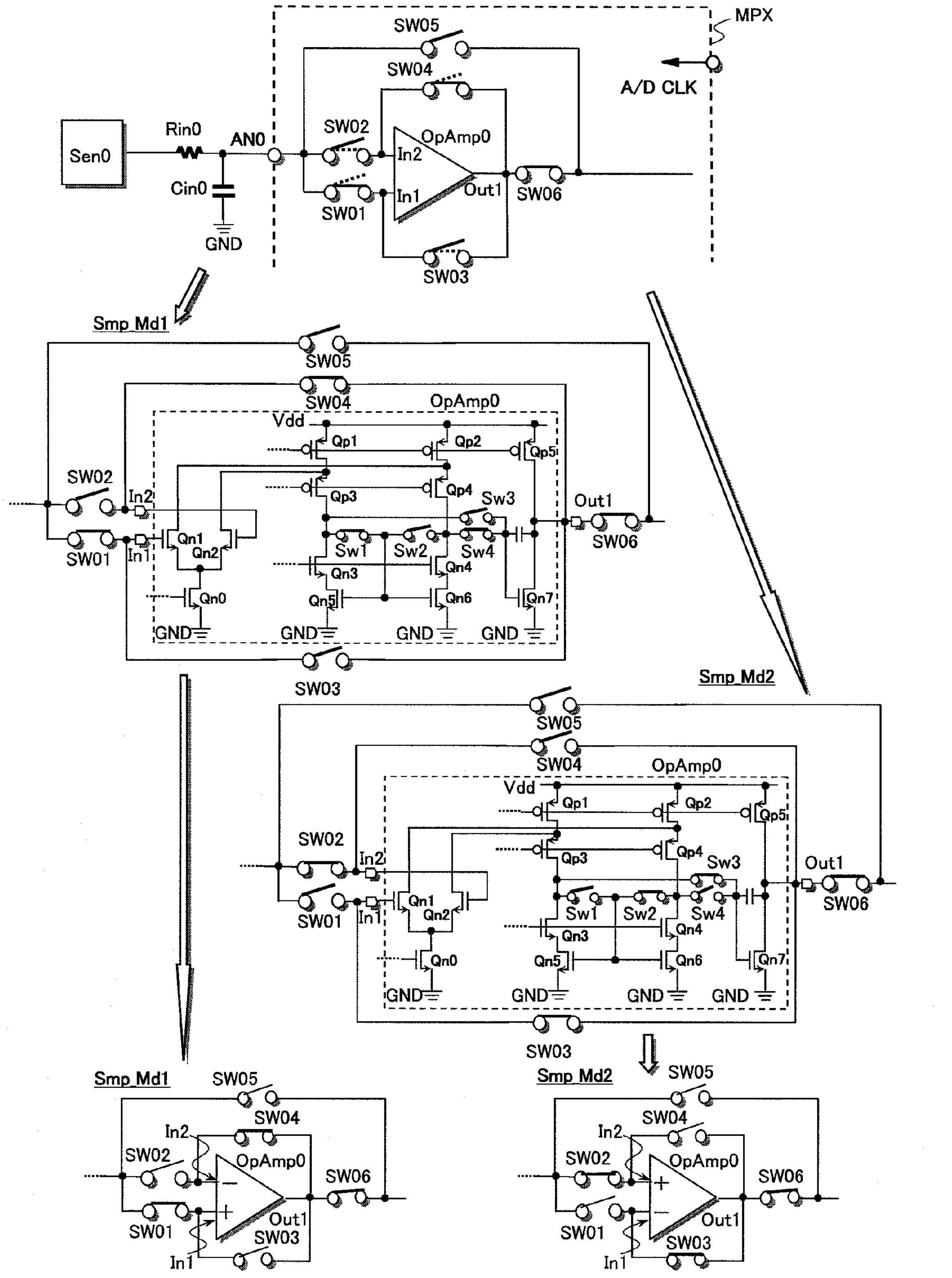
FIG. 7 is a diagram showing how the operational amplifier and the first to sixth switches in each of the channels of the multiplexer shown in FIG. 5 operate in a first selection sample mode and a second selection sample mode.

The sampling circuit samples an analog input signal supplied to the analog input terminal in a first sample mode (Smp_Md1) and a second sample mode (Smp_Md2) (refer to FIGS. 7 and 8).

The A/D converter converts an analog signal sampled by the sampling circuit in the first or second sample mode to a digital signal in a conversion mode after the first or second sample mode (refer to FIG. 5).

In a first half of the first sample mode of the sampling circuit, the first and fourth switches are controlled in an on state and, on the other hand, the second, third, and fifth switches are controlled in an off state.

In the first half of the first sample mode of the sampling circuit, an internal circuit of the operational amplifier is controlled so that the first and second input terminals of the operation amplifier function as a non-inverting input terminal (+) and an inverting input terminal (−) of the operational amplifier, respectively (refer to FIGS. 7 and 8).

Figure 8A:
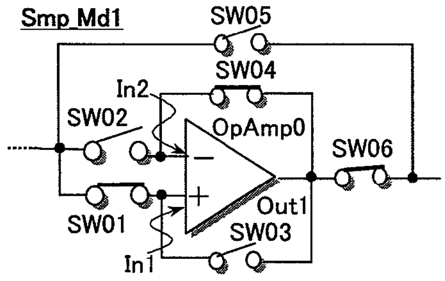
FIGS. 8A to 8C are diagrams for explaining operation of selecting the analog input signal in the first and second selection sample modes as the selection sample mode of the multiplexer shown in FIG. 5.
Figure 8B:
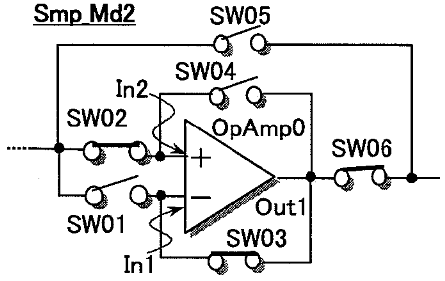
Figure 8C:
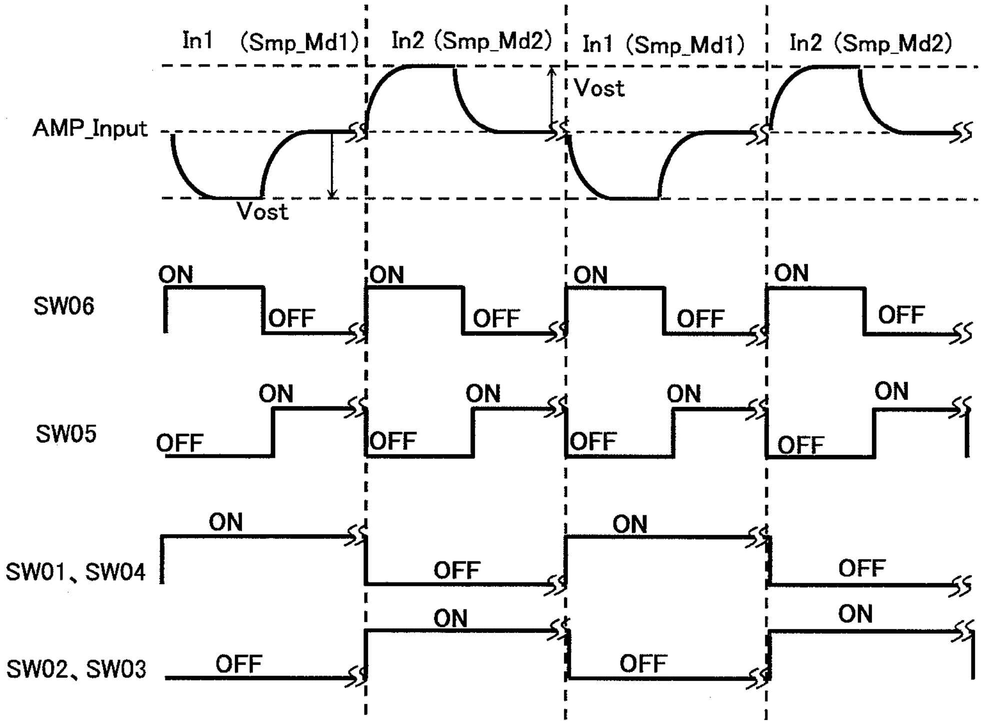

In a latter half of the first sample mode of the sampling circuit, driving of the analog output terminal by the operational amplifier is stopped and, on the other hand, the fifth switch is controlled in the on state (refer to FIG. 8C).

In the latter half of the first sample mode of the sampling circuit, the analog input signal supplied to the analog input terminal is transmitted to the input terminal of the A/D converter via the fifth switch and the analog output terminal (refer to FIG. 8C).

In the first half of the second sample mode of the sampling circuit, the first, fourth, and fifth switches are controlled in an off state and, on the other hand, the second and third switches are controlled in an on state.

In the first half of the second sample mode of the sampling circuit, the internal circuit of the operational amplifier is controlled so that the first and second input terminals of the operational amplifier function as an inverting input terminal (−) and a non-inverting input terminal (+) of the operational amplifier, respectively (refer to FIGS. 7 and 8).

In the latter half of the second sample mode of the sampling circuit, driving of the analog output terminal by the operational amplifier is stopped and, on the other hand, the fifth switch is controlled in the on state (refer to FIG. 8C).

In the latter half of the second sample mode of the sampling circuit, the analog input signal supplied to the analog input terminal is transmitted to the input terminal of the A/D converter via the fifth switch and the analog output terminal (refer to FIG. 8C).

In the embodiment, the function of the non-inverting input terminal and that of the inverting input terminal performed by the first and second input terminals of the operational amplifier switch between the first sample mode and the second sample mode of the sampling circuit. Therefore, the polarity of the sampling error voltage at the signal source impedance of the analog input terminal of the sampling circuit due to the input offset voltage between the first and second input terminals of the operational amplifier switches between the first and second sample modes. As a result, the average error voltage level obtained by time integration of the sampling error voltage whose polarity changes becomes almost zero, so that the offset error voltage at the signal source impedance can be reduced.

In the semiconductor integrated circuit as the preferred embodiment, the first and second sample modes are repeated a plurality of times (refer to FIG. 8C).

In a more preferable embodiment, in the operational amplifier, differential transistors (Qn1 and Qn2) in a differential input stage and cascaded current mirror load transistors (Qn3, Qn5, Qn4, and Qn6) in a drive amplifier stage are transistors of a first conduction type (N channel). The drive amplification stage includes a pair of grounded-gate transistors (Qp3 and Qp4) of a second conduction type (P channel) which is opposite to the first conduction type. A differential output signal of the differential transistors is supplied to the current mirror load transistor via the grounded-gate transistor pair in the drive amplification stage. With the configuration, the operational amplifier is configured as a folded cascade operational amplifier (refer to FIG. 7).

Figure 10:
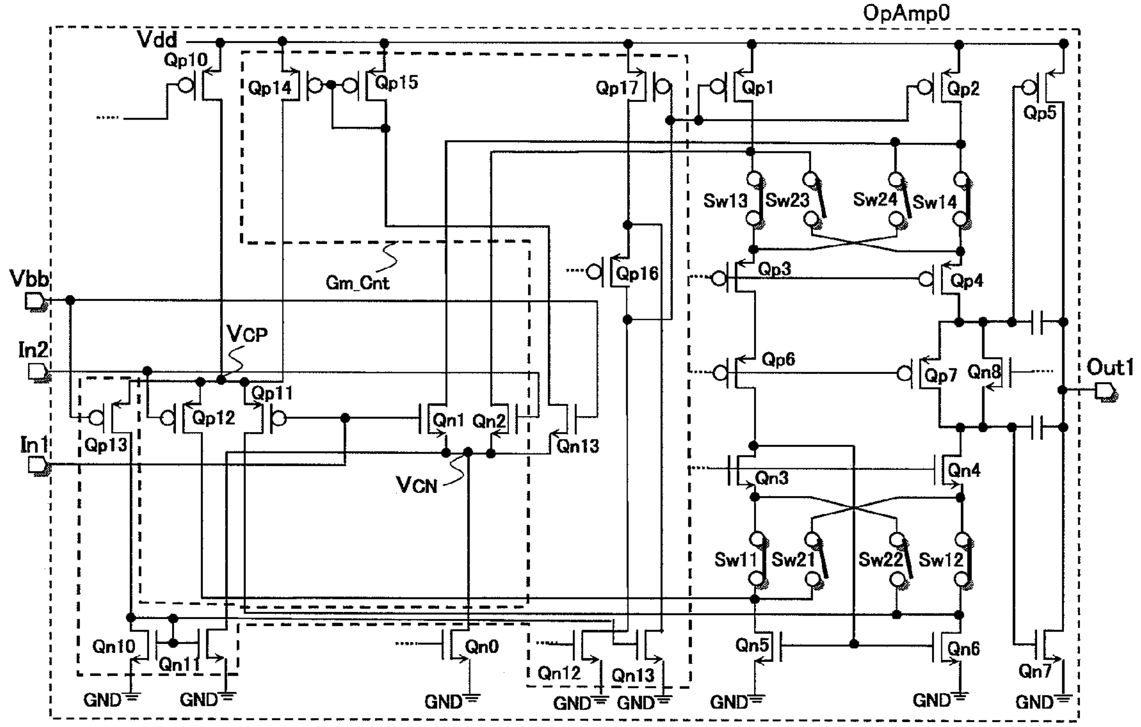
FIG. 10 is a diagram showing further another configuration of the operational amplifier of each of the channels of the multiplexer shown in FIG. 5.

In another more preferable embodiment, the operational amplifier includes a rail-to-rail differential input stage including first differential transistors (Qn1 and Qn2) of a first conduction type (N channel) and second differential transistors (Qp11 and Qp12) of a second conduction type (P channel) opposite to the first conduction type (refer to FIG. 10).

In a concrete embodiment, the differential input stage includes a conductance control circuit (Gm_Cnt) for reducing fluctuations in mutual conductance of the differential input stage due to fluctuations in differential input common mode voltages ($V_{CP}$ and $V_{CN}$) (refer to FIG. 10).

Figure 18:
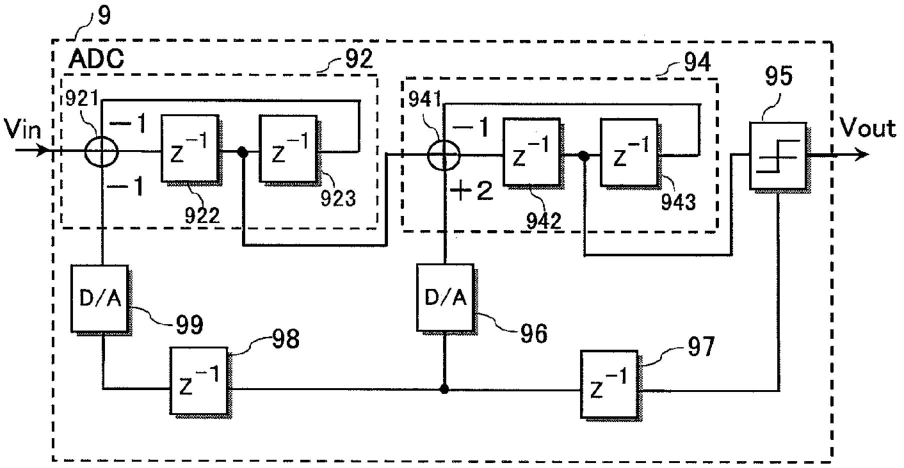
FIG. 18 is a diagram showing a secondary oversampling type ΔΣ A/D converter as another embodiment of the present invention.
Figure 19:
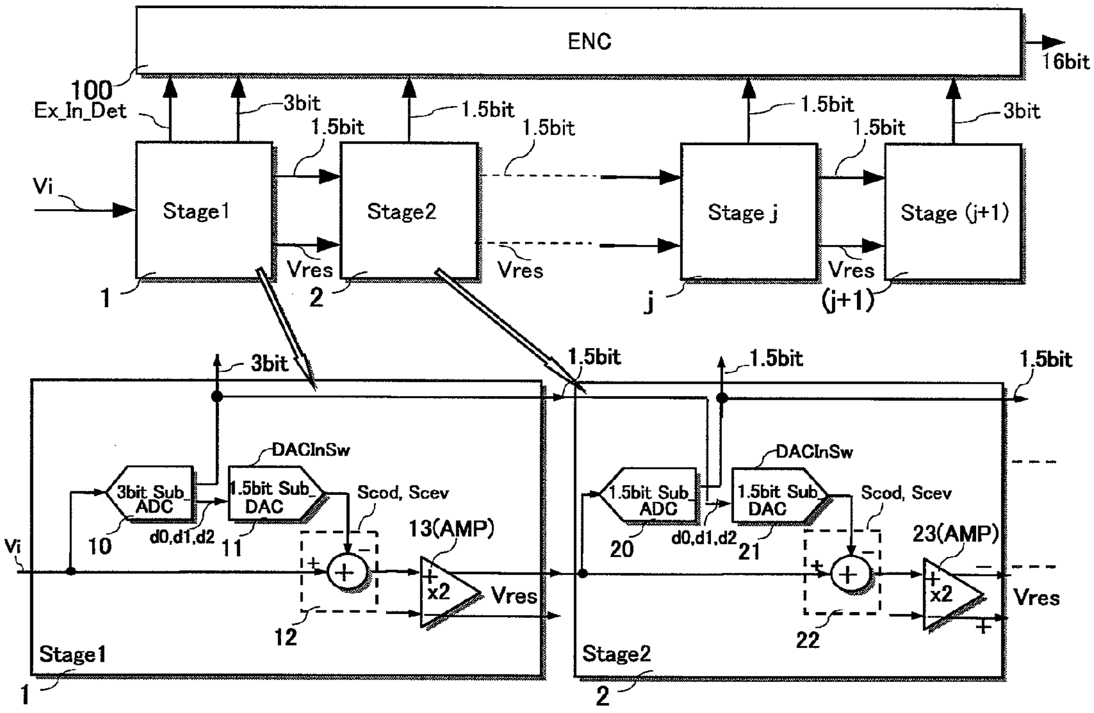
FIG. 19 is a diagram showing a pipeline-type A/D converter capable of performing interleave operation as further another embodiment of the invention.

In another concrete embodiment, the A/D converter is any of a successive-approximation type A/D converter, a flash-type A/D converter, a ΣΔ type A/D converter, and a pipeline-type A/D converter (refer to FIGS. 5, 18, and 19).

In another concrete embodiment, the digital signal converted by the A/D converter is supplied to a central processing unit (CPU) (refer to FIG. 5).

In a most concrete embodiment, the operational amplifier is a CMOS analog operational amplifier, and each of the first, second, third, fourth, and fifth switches is configured by a CMOS analog switch (refer to FIG. 5).

[2]. A semiconductor integrated circuit as a representative embodiment from another viewpoint of the present invention has an A/D converter (10-bit A/D_Conv) and a multiplexer (MPX) coupled to an input terminal of the A/D converter (refer to FIGS. 1 and 5).

The multiplexer includes a plurality of analog input terminals (AN0), an analog output terminal (ADCOM), and a plurality of channels between the plural analog input terminals and the analog output terminal.

Each of the plural channels in the multiplexer includes an operational amplifier (OpAmp0), a first switch (SW01), a second switch (SW02), a third switch (SW03), a fourth switch (SW04), a fifth switch (SW05), and an analog output terminal (ADCOM).

In each of the plural channels in the multiplexer, each of the analog input terminals is coupled to one end of each of the first switches and one end of each of the second switches, the other end of the first switch and the other end of the second switch are coupled to a first input terminal (In1) and a second input terminal (In2) of each of the operational amplifiers, respectively.

In each of the plural channels in the multiplexer, one end and the other end of each of the third switches are coupled to the first input terminal of each of the operational amplifiers and an output terminal of the operational amplifier, respectively. One end and the other end of each of the fourth switches are coupled the first input terminal of the operational amplifier and the output terminal of the operational amplifier, respectively.

In each of the plural channels in the multiplexer, an output terminal of each of the operational amplifiers is coupled to the input terminal of the A/D converter via the analog output terminal.

In each of the plural channels in the multiplexer, one end and the other end of each of the fifth switches are coupled to each of the analog input terminals and the analog output terminal so as to bypass each of the operational amplifiers (refer to FIG. 5).

The multiplexer samples an analog input signal supplied to an arbitrary analog input terminal selected from the plural analog input terminals in a first sample mode (Smd_Md1) and a second sample mode (Smp_Md2) (refer to FIGS. 7 and 8).

The A/D converter converts an analog signal sampled by the multiplexer in the first or second sample mode to a digital signal in a conversion mode after the first or second sample mode (refer to FIG. 5).

In a first half of the first sample mode of the multiplexer, the first and fourth switches are controlled in an on state and, on the other hand, the second, third, and fifth switches are controlled in an off state.

In the first half of the first sample mode of the multiplexer, an internal circuit of the operational amplifier is controlled so that the first and second input terminals of the operational amplifier function as a non-inverting input terminal (+) and an inverting input terminal (−) of the operational amplifier, respectively (refer to FIG. 7 and FIGS. 8A to 8C).

In a latter half of the first sample mode of the multiplexer, driving of the analog output terminal by the operational amplifier is stopped and, on the other hand, the fifth switch is controlled in the on state (refer to FIG. 8C).

In the latter half of the first sample mode of the multiplexer, the analog input signal supplied to the analog input terminal is transmitted to the input terminal of the A/D converter via the fifth switch and the analog output terminal (refer to FIG. 8C).

In the first half of the second sample mode of the multiplexer, the first, fourth, and fifth switches are controlled in an off state and, on the other hand, the second and third switches are controlled in an on state.

In the first half of the second sample mode of the multiplexer, the internal circuit of the operational amplifier is controlled so that the first and second input terminals of the operational amplifier function as an inverting input terminal (−) and a non-inverting input terminal (+) of the operational amplifier, respectively (refer to FIGS. 7 and 8).

In the latter half of the second sample mode of the multiplexer, driving of the analog output terminal by the operational amplifier is stopped and, on the other hand, the fifth switch is controlled in the on state (refer to FIG. 8C).

In the latter half of the second sample mode of the multiplexer, the analog input signal supplied to the analog input terminal is transmitted to the input terminal of the A/D converter via the fifth switch and the analog output terminal (refer to FIG. 8C).

In the embodiment, the function of the non-inverting input terminal and that of the inverting input terminal performed by the first and second input terminals of the operational amplifier switch between the first sample mode and the second sample mode of the multiplexer. Therefore, the polarity of the sampling error voltage at the signal source impedance of the analog input terminal of the multiplexer due to the input offset voltage between the first and second input terminals of the operational amplifier switches between the first and second sample modes. As a result, the average error voltage level obtained by time integration of the sampling error voltage whose polarity changes becomes almost zero, so that the offset error voltage at the signal source impedance can be reduced.

In the semiconductor integrated circuit as the preferred embodiment, the first and second sample modes are repeated a plurality of times (refer to FIG. 8C).

In a more preferable embodiment, in the operational amplifier, differential transistors (Qn1 and Qn2) in a differential input stage and cascaded current mirror load transistors (Qn3, Qn5, Qn4, and Qn6) in a drive amplifier stage are transistors of a first conduction type (N channel). The drive amplification stage includes a pair of grounded-gate transistors (Qp3 and Qp4) of a second conduction type (P channel) which is opposite to the first conduction type. A differential output signal of the differential transistors is supplied to the current mirror load transistor via the grounded-gate transistor pair in the drive amplification stage. With the configuration, the operational amplifier is configured as a folded cascade operational amplifier (refer to FIG. 7).

In another more preferable embodiment, the operational amplifier includes a rail-to-rail differential input stage including first differential transistors (Qn1 and Qn2) of a first conduction type (N channel) and second differential transistors (Qp11 and Qp12) of a second conduction type (P channel) opposite to the first conduction type (refer to FIG. 10).

In a concrete embodiment, the differential input stage includes a conductance control circuit (Gm_Cnt) for reducing fluctuations in mutual conductance of the differential input stage due to fluctuations in differential input common mode voltages ($V_{CP}$ and $V_{CN}$) (refer to FIG. 10).

Figure 14:
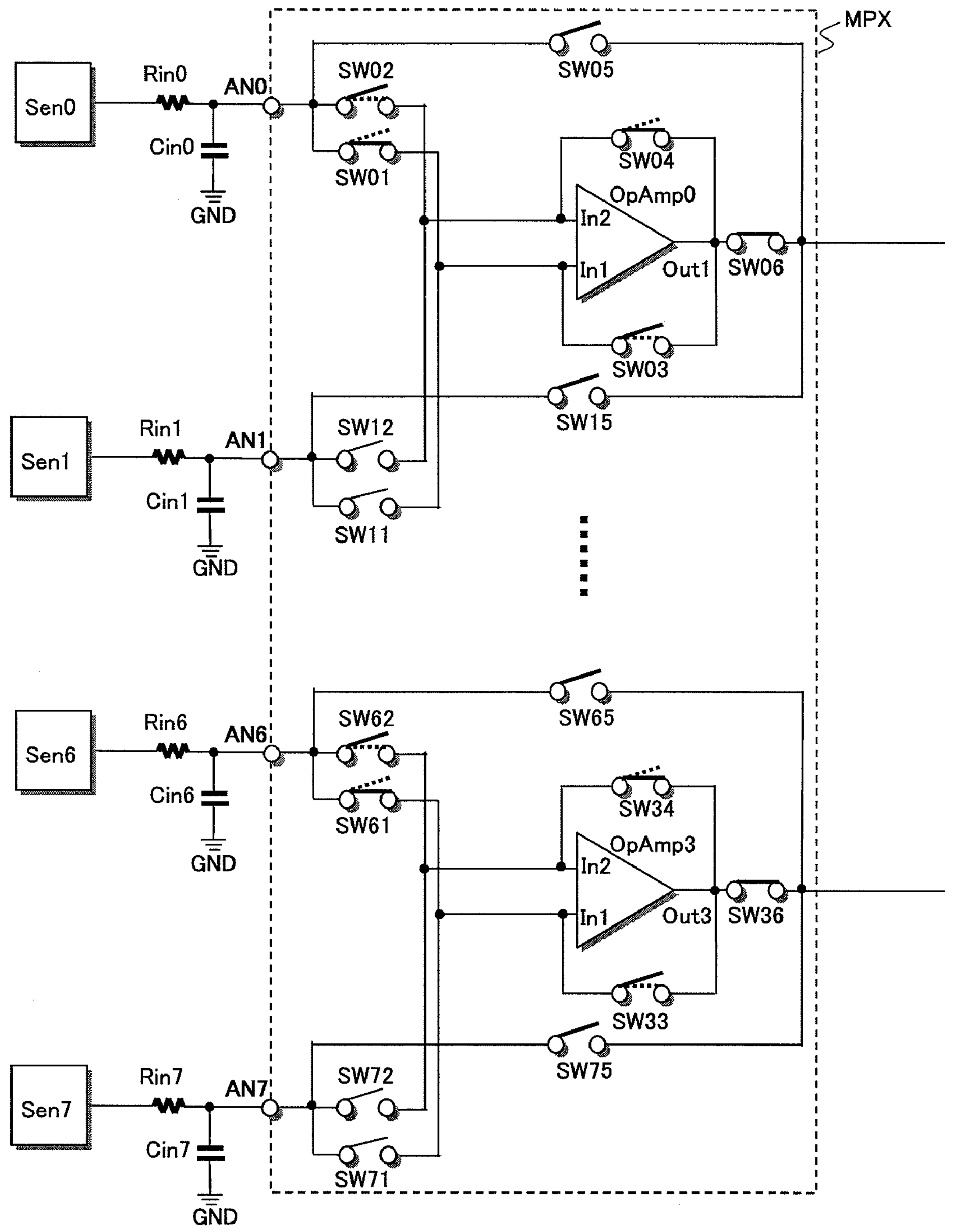
FIG. 14 is a diagram showing another internal configuration of the multiplexer of the monolithic integrated circuit as an embodiment of the invention illustrated in FIG. 1.
Figure 16:
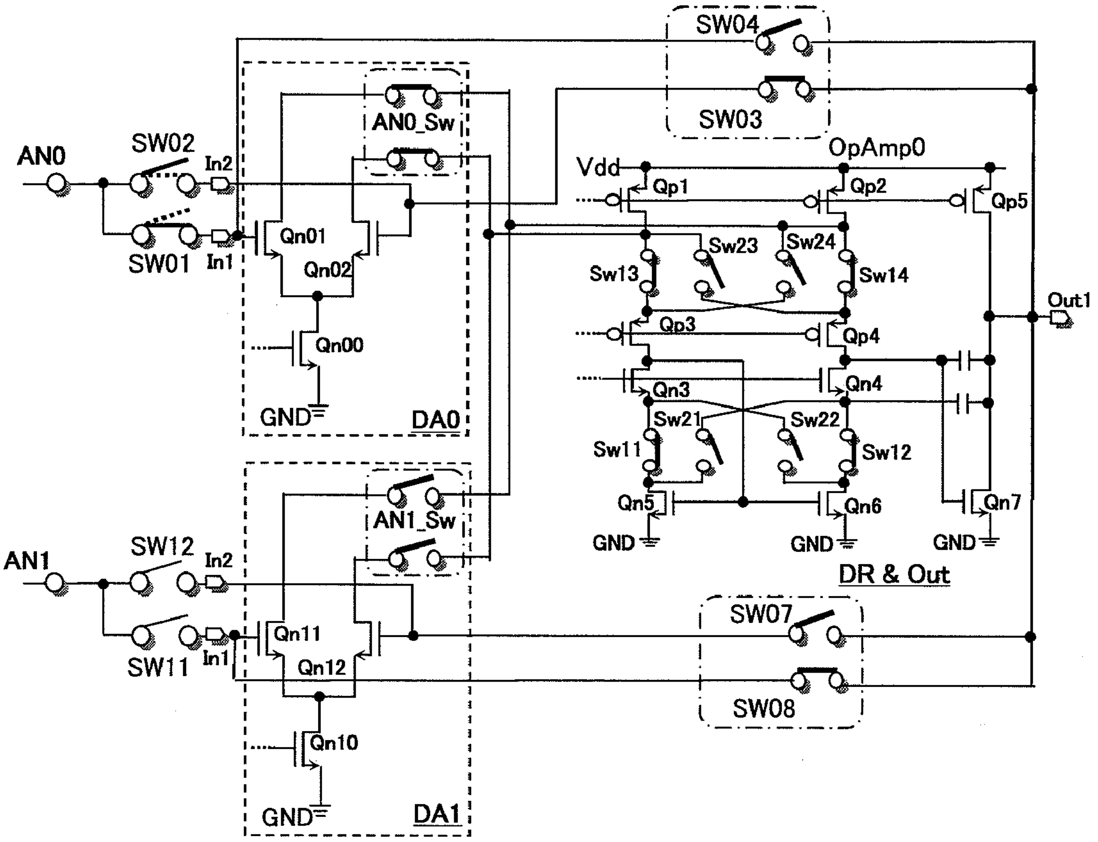
FIG. 16 is a diagram showing another internal configuration of a multiplexer in a monolithic semiconductor integrated circuit as an embodiment of the present invention shown in FIG. 1.

In another concrete embodiment, two adjacent channels in the plural channels in the multiplexer share a single operational amplifier (refer to FIGS. 14 and 16).

In further another concrete embodiment, each of two adjacent channels in the plural channels in the multiplexer includes a differential amplification stage of a dedicated operational amplifier, and the two adjacent channels share a single drive amplification stage and output amplification stage of an operational amplifier to which a signal from the differential amplification stage is supplied (refer to FIG. 16).

In another concrete embodiment, the A/D converter is any of a successive-approximation type A/D converter, a flash-type A/D converter, a ΣΔ type A/D converter, and a pipeline-type A/D converter (refer to FIGS. 5, 18, and 19).

In a most concrete embodiment, the operational amplifier is a CMOS analog operational amplifier, and each of the first, second, third, fourth, and fifth switches is configured by a CMOS analog switch(refer to FIG. 5).

The embodiments will be described in more details.

<<In-Vehicle Microcomputer>>

FIG. 1 is a diagram showing a monolithic semiconductor integrated circuit as an embodiment of the present invention. The monolithic semiconductor integrated circuit is, as described in the patent document 1, an in-vehicle microcomputer including an analog multiplexer and a successive-approximation-type A/D converter on a semiconductor substrate of a semiconductor integrated circuit.

As shown in the diagram, a semiconductor chip of a semiconductor integrated circuit includes an analog circuit part Analog_Cir, a digital circuit part Digital_Cir, and a central processing unit (CPU, not shown).

The analog circuit part Analog_Cir includes eight-channel analog input terminals AN0, AN1, AN2, . . . , and AN7, a one-channel analog-output multiplexer MPX, and a 10-bit successive-approximation-type A/D converter 10-bit A/D_Conv. The analog circuit part Analog_Cir also includes a 10-bit local D/A converter 10-bit Local D/A_Conv.

The digital circuit part Digital_Cir includes a control circuit Control_Cir. The control circuit Control_Cir is controlled by the 10-bit successive-approximation-type A/D converter 10-bit A/D_Conv, and controls the 10-bit local D/A converter 10-bit local D/A_Conv via a local D/A converter register Local D/A Reg. To the control circuit Control_Cir, four data registers Data Reg A, B, C, and D, a status register Status Reg, and a control register Control Reg are coupled. To the four data registers Data Reg A, B, C, and D, the status register Status Reg, and the control register Control Reg, a bus interface Bus_Int is coupled via a module data bus Mod_Data_Bus. To the bus interface Bus_Int, an internal data bus Int_Data_Bus is also coupled. Although not shown, to the bus interface Bus_Int, the central processing unit (CPU) is coupled via a peripheral bus and a bus switch controller (bus control circuit). As necessary, a digital signal processing unit (DSP) may be coupled to the bus interface Bus_Int via a peripheral bus and a bus switch controller. Via the periphery bus, the A/D converter can output an A/D conversion result to the central processing unit, the digital signal processing unit, and other circuits (not shown) coupled to the periphery bus.

The local D/A converter 10-bit Local D/A_Conv in the analog circuit part Analog_Cir includes 257 resistors R0, R1, . . . , R127, R128, R129, R130, R131, . . . , R255, and R256 coupled in series. The 10-bit local D/A converter 10-bit Local D/A_Conv includes 256 higher-bit switches controlled by a higher 8-bit decoder 8-bit DEC and four lower-bit switches controlled by a lower 2-bit decoder 2-bit DEC.

A higher-bit reference voltage $V_{REF1}$ selected by the 256 higher-bit switches of the 10-bit local D/A converter 10-bit local D/A_Conv is supplied to a sampling capacitor C1 of the input of a comparator Comp of the 10-bit successive-approximation-type A/D converter 10-bit A/D_Conv via an operational amplifier OP1. A lower-bit reference voltage $V_{REF2}$ selected by the four lower-bit switches of the 10-bit local D/A converter 10-bit local D/A_Conv is supplied to another sampling capacitor C4 of the input of a comparator Comp of the 10-bit successive-approximation-type A/D converter 10-bit A/D_Conv via an operational amplifier OP2. As described in the patent document 1, transfer switches SW1 and SW2 for reducing the influence of the offset voltage are coupled between the non-inverting input terminal and the output terminal of each of the operational amplifiers OP1 and OP2.

First, the operational amplifiers OP1 and OP2 are activated, and the transfer switches SW1 and SW2 are controlled in the off state. After that, while the operational amplifiers OP1 and OP2 are made inactive, the transfer switches SW1 and SW2 are controlled in the on state, and the higher-bit reference voltage $V_{REF1}$ and lower-bit reference voltage $V_{REF2}$ in which the influence of the offset voltages of the operational amplifiers OP1 and OP2 is reduced can be generated.

The A/D converting operation of the 10-bit successive-approximation-type A/D converter 10-bit A/D_Conv is executed as follows.

First, in the sample mode, analog input signal voltage of the input terminal of any of the analog input terminals AN0, AN1, AN2, . . . , and AN7 of eight channels is selected by the multiplexer MPX, and the selected analog input signal voltage is output to the analog output terminal ADCOM of one channel. The selected analog input signal voltage of the analog output terminal ADCOM is supplied to one end of the sampling capacitor C1 via a switch SW3. At this time, the non-inverting input terminal + of the operational amplifier in the comparator Comp is coupled to the ground voltage GND, and a switch SW4 between the inverting input terminal – and the output terminal of the operational amplifier is controlled in the on state, so that the inverting input terminal – is set to virtual ground potential. Therefore, since the other end of the sampling capacitor C1 is also at the virtual grounding potential, the selected analog input signal voltage of the analog output terminal ADCOM is applied across the sampling capacitor C1.

In the conversion mode, the switch SW4 between the inverting input terminal – and the output terminal of the operational amplifier is controlled in the off state, the high-order bit reference voltage $V_{REF1}$ of the operational amplifier OP1 is supplied to one end of the sampling capacitor C1 via the switch SW3, and the low-order bit reference voltage $V_{REF2}$ of the operational amplifier OP2 is supplied to one end of the capacitor C4. According to the positive/negative sign of the differential voltage between addition reference voltage of the higher-order bits and the lower-order bits and the selected analog input signal voltage, a logic determination result is obtained from the output terminal of the operational amplifier of the comparator Comp.

During the operations in the sample mode and the conversion mode, as described in the non-patent document 2, the influence of the offset voltage of the operational amplifier as a component of the comparator Comp of the 10-bit successive-approximation-type A/D converter 10-bit A/D_Conv can be reduced by the correlated double sampling.

In response to the logic determination result of the comparator Comp, the control circuit Control_Cir updates the data retained in the local D/A conversion register Local D/A Reg in accordance with a predetermined search algorithm such as binary search. Specifically, whether the selected analog input signal voltage is higher than the half of the analog input dynamic range of the 10-bit successive-approximation-type A/D converter 10-bit A/D_conv or not is determined. After that, on the basis of the determination result, whether the next criterion is set to ¾ of the dynamic range or ¼ of the dynamic range is determined. The next criterion is determined by the high-order bit reference voltage $V_{REF1}$ and the low-order bit reference voltage $V_{REF2}$ from the 10-bit local D/A converter 10-bit Local D/A_Conv responding to the updated data retained in the local D/A converter register Local D/A Reg.

For example, by repeating the determination according to the predetermined search algorithm such as binary search, the data retained in the local D/A converter register Local D/A Reg is converged to a 10-bit A/D conversion result of the selected analog input signal voltage.

<<Internal Configuration of Multiplexer and External Circuit of Analog Input Terminal of Multiplexer>>

FIG. 5 is a diagram showing the internal configuration of the multiplexer MPX of the monolithic semiconductor integrated circuit and external circuits coupled to the analog input terminals AN0, AN1, . . . and AN7 of the multiplexer MPX as an embodiment of the present invention shown in FIG. 1. The external circuits are configured by in-vehicle parts which are mounted on a vehicle.

In FIG. 5, eight various in-vehicle sensors Sen0, Sen1, . . . , and Sen7 are coupled to the analog input terminals AN0, AN1, . . . , and AN7 of the multiplexer MPX via resistors Rin0, Rin1, . . . , and Rin7 and capacitors Cin0, Cin1, . . . , and Cin7, respectively. To one end of each of the in-vehicle sensors Sen0, Sen1, . . . , and Sen7, battery voltage of the vehicle is supplied. The other ends of the in-vehicle sensors Sen0, Sen1, . . . , and Sen7 are coupled to the resistors Rin0, Rin1, . . . , and Rin7. The resistors Rin0 to Rin7 of the analog input terminals AN0 to AN7 of the multiplexer MPX are provided to prevent the battery voltage (12 volts) of the vehicle from being directly supplied to the analog input terminals AN0 to AN7 of the multiplexer due to a failure in the in-vehicle sensors Sen0 to Sen7, and have a resistance value of 20 KΩ. The capacitors Cin0 to Cin7 coupled to the resistors Rin0 to Rin7 are provided to absorb surge voltage pulses from the in-vehicle sensors Sen0 to Sen7 and have a capacitance value of about 0.1 microfarad. The eight in-vehicle sensors Sen0, Sen1, . . . , and Sen7 output tire skidding information or the like responding to various engine related information, handle operation, and brake operation related to operating states of the vehicle of a temperature sensor, a pressure sensor, an acceleration sensor, and the like.

As shown in FIG. 5, the channels of the multiplexer MPX are configured by operational amplifiers OpAmp0 to OpAmp7, first switches SW01 to SW71, second switches SW02 to SW72, third switches SW03 to SW73, fourth switches SW04 to SW74, fifth switches SW05 to SW75, and sixth switches SW06 to SW76, respectively. The first input terminals In1 of the operational amplifiers OpAmp0 to OpAmp7 are coupled to the analog input terminals AN0 to AN7 of the multiplexer MPX via the first switches SW01 to SW71, respectively. The second input terminals In2 of the operational amplifiers OpAmp0 to OpAmp7 are coupled to the analog input terminals AN0 to AN7 of the multiplexer MPX via the second switches SW02 to SW72, respectively. The output terminals of the operational amplifiers OpAmp0 to OpAmp7 are coupled to the first input terminals In1 via the third switches SW03 to SW73, respectively. The output terminals of the operational amplifiers OpAmp0 to OpAmp7 are coupled to the second input terminals In2 via the fourth switches SW04 to SW74, respectively. Further, the output terminals of the operational amplifiers OpAmp0 to OpAmp7 are coupled to the one input terminal ADCOM of the switch SW3 of the 10-bit successive-approximation-type A/D converter 10-bit A/D_Conv via the sixth switches SW06 to SW76, respectively. The fifth switches SW05 to SW75 couple the analog input terminals AN0 to AN7 of the multiplexer MPX to one input terminal ADCOM of the switch SW3 of the successive-approximation-type A/D converter 10-bit A/D_Conv while bypassing the operational amplifiers OpAmp0 to OpAmp7 and the sixth switches SW06 to SW76.

The operational amplifiers OpAmp0 to OpAmp7 take the form of CMOS analog operational amplifiers. Each of the first switches SW01 to SW71, second switches SW02 to SW72, third switches SW03 to SW73, fourth switches SW04 to SW74, fifth switches SW05 to SW75, and sixth switches SW06 to SW76 is configured by a CMOS analog switch.

<<Repetition of First Selection Sample Mode and Second Selection Sample Mode in Multiplexer>>

The selection sample mode of the analog input terminals AN0 to AN7 of the multiplexer MPX is performed by repetition of a first selection sample mode Smp_Md1 and a second selection sample mode Smp_Md2 as shown in FIGS. 8A to 8C.

FIGS. 8A to 8C are diagrams for explaining the analog input signal selecting operation in the first selection sample mode Smp_Md1 and the second selection sample mode Smp_Md2 as the selection sample modes of the multiplexer MPX shown in FIG. 5.

First, as shown in FIG. 8A, in the first selection sample mode Smp_Md1, the first and second input terminals In1 and In2 of each of the operational amplifiers OpAmp0 to OpAmp7 function as a non-inverting input terminal (+) and an inverting input terminal (–) of the operational amplifier, respectively.

On the contrary, as shown in FIG. 8B, in the second selection sample mode Smp_Md2, the first and second input terminals In1 and In2 of each of the operational amplifiers OpAmp0 to OpAmp7 function as an inverting input terminal (−) and a non-inverting input terminal (+) of each of the operational amplifiers OpAmp0 to OpAmp7, respectively.

Therefore, as shown in FIG. 8C, each of the analog input terminals AN0 to AN7 of the multiplexer MPX repeats the first selection sample mode Smp_Md1 and the second selection sample mode Smp_Md2. Consequently, the first input terminal In1 functions as the non-inverting input terminal + of each of the operational amplifiers as the analog input terminals of the multiplexer MPX in the first selection sample mode Smp_Md1. The second input terminal In2 functions as the non-inverting input terminal + in the second selection sample mode Smp_Md2. On the contrary, the second input terminal In2 functions as the inverting input terminal − as a negative feedback terminal of each of the operational amplifiers in the first selection sample mode Smp_Md1. The first input terminal In1 functions as the inverting input terminal − in the second selection sample mode Smp_Md2. In the first selection sample mode Smp_Md1, the first switches SW01 to SW71 function as switches for coupling the analog input terminals of the multiplexer MPX to the non-inverting input terminals + of the operational amplifiers. In the second selection sample mode Smp_Md2, the second switches SW02 to SW72 function as the switches. Further, in the first selection sample mode Smp_Md1, the fourth switches SW04 to SW74 function as switches for coupling the output terminals of the operational amplifiers to the inverting input terminals −. In the second selection sample mode Smp_Md2, the third switches SW03 to SW73 function as the switches. In a first half of a sampling period of either the first selection sample mode Smp_Md1 or the second selection sample mode Smp_Md2, the sixth switches SW06 to SW76 are controlled in the on state and, the fifth switches SW05 to SW75 are controlled in the off state. Therefore, in the first half of the sampling period, an output of each of the operational amplifiers is influenced by the input offset voltage across the non-inverting input terminal + and the inverting input terminal − of the operational amplifier. Further, in the latter half of the sampling period of either the first selection sample mode Smp_Md1 or the second selection sample mode Smp_Md2, the sixth switches SW06 to SW76 are controlled in the off state and, the fifth switches SW05 to SW75 are controlled in the on state. Therefore, in the latter half of the sampling period, the influence of the input offset voltage across the non-inverting input terminal + and the inverting input terminal − of each of the operational amplifiers, onto the output of each of the operational amplifier is reduced by the bypass function of the fifth switches SW05 to SW75.

In particular, as shown in an upper part of FIG. 8C, the polarity of the sampling error voltage Vost due to the input offset voltage Voff of the operational amplifier with respect to the analog input voltage of each of the analog input terminals of the multiplexer MPX changes between the first selection sample mode Smp_Md1 and the second selection sample mode Smp_Md2. Therefore, the average error voltage level obtained by time integration of the sampling error voltage Vost whose polarity changes becomes almost zero, so that the level of the stationary offset error voltage with respect to the analog input signal voltages of the analog input terminals AN0 to AN7 of the multiplexer MPX can be reduced.

Between the first selection sample mode Smp_Md1 and the second selection sample mode Smp_Md2, a conversion mode of A/D converting an analog input signal to a digital signal is executed. In the A/D conversion mode, successive approximation between the voltage level of the analog output terminal ADCOM of the multiplexer in the latter half of the sampling period by the 10-bit successive-approximation-type A/D converter of FIG. 5 and addition reference voltage of high-order and low-order bits of the local D/A converter register in FIG. 1 is executed.

<<Operation of Repeating Analog Input Signal Selecting Operation and A/D converting Operation>>

Figure 6:
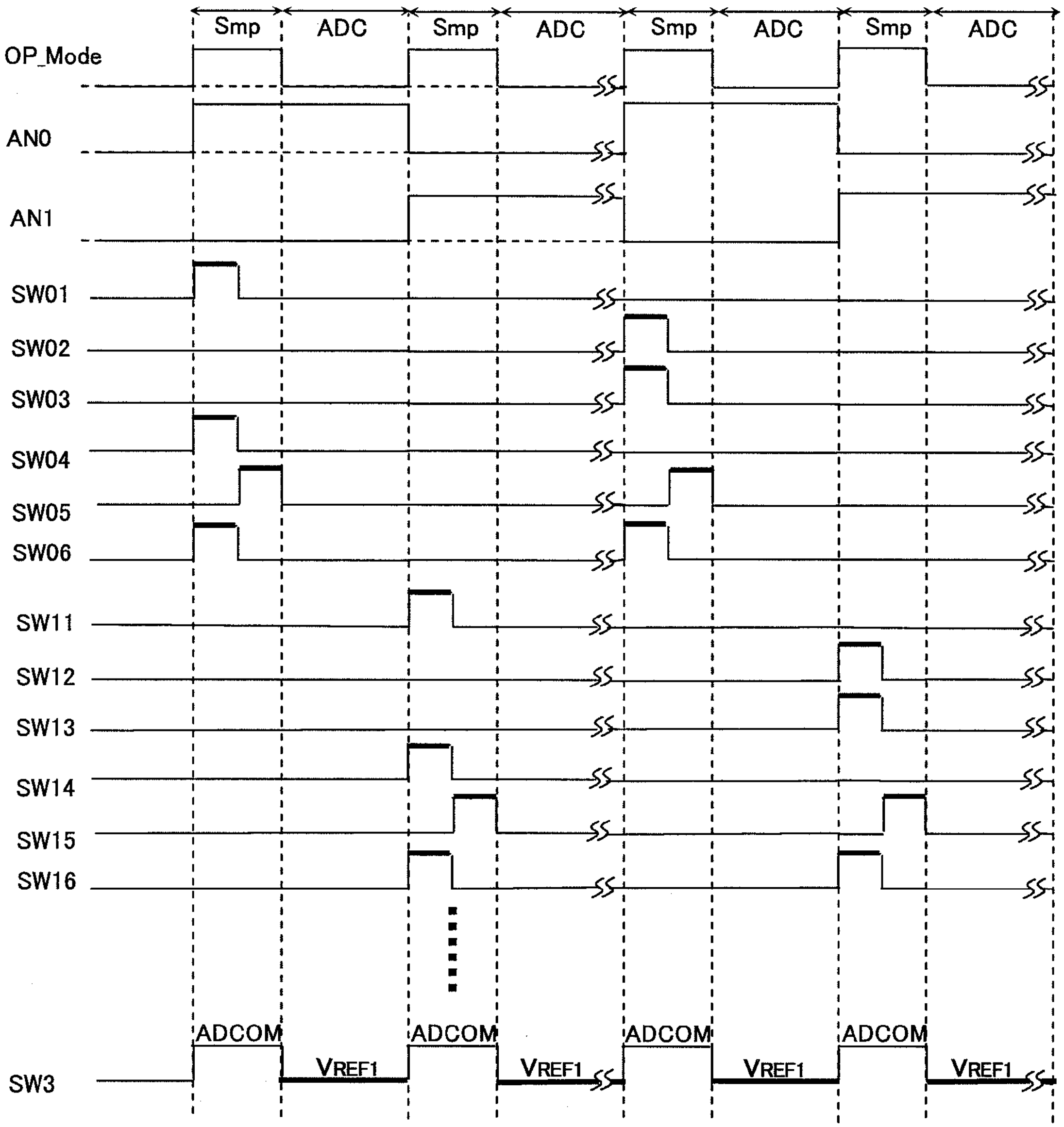
FIG. 6 is a diagram for explaining operation of repeating operation of selecting the analog input signal in the selection sample mode of the multiplexer shown in FIG. 1 and operation of A/D converting the analog input signal in the conversion mode by the 10-bit successive-approximation-type A/D converter of FIG. 5.

FIG. 6 is a diagram for explaining the operation of repeating an operation Smp of selecting an analog input signal in the selection sampling mode of the multiplexer shown in FIG. 1 and A/D converting operation ADC of an analog input signal in the conversion mode of the 10-bit successive-approximation type A/D converter shown in FIG. 5. In the selecting operation Smp in the repetitive selecting sample mode, the multiplexer MPX sequentially and periodically samples the analog input signal voltages of the analog input terminals AN0 to AN7 of eight channels in a time-division manner. In the A/D converting operation ADC in the repetitive converting mode, the 10-bit successive-approximation-type A/D converter 10-bit A/D_Conv converts the analog input signal voltage sampled by the multiplexer MPX just before that to a digital signal. In such a manner, the 10-bit successive-approximation-type A/D converter 10-bit A/D_Conv converts analog input signal voltages of the analog input terminals AN0 to AN7 of eight channels to digital signals in order.

Particularly, in FIG. 6, the first selecting operation Smp of the analog input terminal AN0 of the zero channel of the multiplexer MPX is similar to that in the first selection sample mode Smp_Md1 described with reference to FIG. 8A. Specifically, in a first half of the first selecting operation Smp, the first switch SW01 and the fourth switch SW04 are in the on state, the second switch SW02 and the third switch SW03 are in the off state, the fifth switch SW05 is in the off state, and the sixth switch SW06 is in the on state. Further, in the latter half of the first selecting operation Smp, the fifth switch SW05 is in the on state, and the sixth switch SW06 is in the off state.

The first selecting operation Smp of the analog input terminal AN1 of the first channel of the multiplexer MPX is similar to that in the first selection sample mode Smp_Md1 described with reference to FIG. 8A. Specifically, in the first half of the first selecting operation Smp, the first switch SW11 and the fourth switch SW14 are in the on state, the second switch SW12 and the third switch SW13 are in the off state, the fifth switch SW15 is in the off state, and the sixth switch SW16 is in the on state. Further, in the latter half of the first selecting operation Smp, the fifth switch SW15 is in the on state, and the sixth switch SW16 is in the off state.

Further, in FIG. 6, the second selecting operation Smp of the analog input terminal AN0 of the zero channel of the multiplexer MPX is similar to that in the second selection sample mode Smp_Md2 described with reference to FIG. 8B. Specifically, in a first half of the second selecting operation Smp, the first switch SW01 and the fourth switch SW04 are in the off state, the second switch SW02 and the third switch SW03 are in the on state, the fifth switch SW05 is in the off state, and the sixth switch SW06 is in the on state. Further, in the latter half of the second selecting operation Smp, the fifth switch SW05 is in the on state, and the sixth switch SW06 is in the off state.

The second selecting operation Smp of the analog input terminal AN1 of the first channel of the multiplexer MPX is similar to that in the second selection sample mode Smp_Md2 described with reference to FIG. 8B. Specifically, in a first half of the second selecting operation Smp, the first switch SW11 and the fourth switch SW14 are in the off state, the second switch SW12 and the third switch SW13 are in the on state, the fifth switch SW15 is in the off state, and the sixth switch SW16 is in the on state. Further, in the latter half of the second selecting operation Smp, the fifth switch SW15 is in the on state, and the sixth switch SW16 is in the off state.

<<Operation of Operational Amplifier in Selection Sample Mode>>

FIG. 7 is a diagram showing how the operational amplifiers OpAmp0 . . . and the first switch SW01 to the sixth switch SW06 in each of the channels of the multiplexer MPX shown in FIG. 5 operate in the first selection sample mode Smp_Md1 and the second selection sample mode Smp_Md2.

In an upper part of FIG. 7, the operational amplifier OpAmp0 of the zero channel of the multiplexer MPX and the first switch SW01 to the sixth switch SW06 shown in FIG. 5 are illustrated.

In upper and lower parts in the center of FIG. 7, the internal circuit configuration of the operational amplifier OpAmp0 is shown. The operational amplifier OpAmp0 shown in the upper and lower parts in the center of FIG. 7 is a folded-cascade-type operational amplifier having a high open loop voltage gain. The operational amplifier OpAmp0 includes a differential input stage having NMOS differential transistors Qn1 and Qn2 responding to the differential input signal of the first and second input terminals In1 and In2, and the NMOS current source transistor Qn0. A drain differential output signal of the NMOS differential transistors Qn1 and Qn2 in the differential input stage is supplied to the source of each of the grounded-gate PMOS amplification transistors Qp3 and Qp4 in the drive amplification stage. Between the sources of the grounded-gate PMOS amplification transistors Qp3 and Qp4 and the power source voltage Vdd, grounded-gate PMOS bias transistors Qp1 and Qp2 at high impedance are coupled. Between the drains of the grounded gate PMOS amplification transistors Qp3 and Qp4 and the grounded voltage GND, a low-voltage current mirror load is coupled. The low-voltage current mirror load is configured by switches Sw1, Sw2, Sw3, and Sw4, and NMOS transistors Qn3, Qn4, Qn5, and Qn6. In the low-voltage current mirror load, the NMOS transistors Qn3 and Qn5 are cascaded, and the NMOS transistors Qn4 and Qn6 are cascaded, so that the load impedance of the cascaded NMOS transistors has a high value. Therefore, the operational amplifier OpAmp0 of high open loop voltage gain can be formed. Further, the drain differential output signal of the NMOS differential transistors Qn1 and Qn2 is folded back toward the ground voltage GND via the grounded-gate PMOS amplification transistors Qp3 and Qp4 and the low-voltage current mirror loads Qn3, Qn4, Qn5, and Qn6. By the folded coupling, the circuit operation with the low power source voltage Vdd is achieved.

As shown in the upper part in the center of FIG. 7, in the first half of the selecting operation Smp of the first selection sample mode Smp_Md1, the first switch SW01 and the fourth switch SW04 are in the on state, the second switch SW02 and the third switch SW03 are in the off state, the fifth switch SW05 is in the off state, and the sixth switch SW06 is in the on state. At this time, the switches Sw1 and Sw4 are in the on state, and the switches Sw2 and Sw3 are in the off state. At this time, the NMOS transistors Qn3 and Qn5 cascaded function as input transistors of the current mirror, and the other cascaded NMOS transistors Qn4 and Qn6 function as output transistors of the current mirror. The drain signal of the output transistor Qn4 in the current mirror as a single-end output signal of the drive amplification stage is supplied to the gate of the grounded-source NMOS transistor Qn7 of the output amplification stage via the switch Sw4 in the on state. Between the drain of the grounded-source NMOS transistor Qn7 in the output amplification stage and the power source voltage Vdd, the PMOS load transistor Qp5 of high impedance is coupled.

In the first selection sample mode Smp_Md1, when an input signal of the high voltage level is supplied to the first input terminal In1 of the gate of the NMOS differential transistor Qn1 via the first switch SW01 in the on state, the drain voltage of the other NMOS differential transistor Qn2 rises. Therefore, the conduction degree of the grounded-gate PMOS amplification transistor Qp3 in the drive amplification stage increases, and the conduction degree of the other grounded-gate amplifier PMOS amplification transistor Qp4 decreases. Therefore, the drain voltage of the output transistor Qn4 in the current mirror as a single-end output signal of the driving amplification stage rises.

As a result, as shown in the lower left part of FIG. 7, in the first selection sample mode Smp_Md1, the first input terminal In1 and the second input terminal In2 in each of the operational amplifiers OpAmp0 to OpAmp7 function as the non-inverting input terminal + and the inverting input terminal −, respectively, in each of the operational amplifiers OpAmp0 to OpAmp7.

As shown in the center low part of FIG. 7, in the first half of the selecting operation Smp of the second selection sample mode Smp_Md1, the first switch SW01 and the fourth switch SW04 are in the off state, the second switch SW02 and the third switch SW03 are in the on state, the fifth switch SW05 is in the off state, and the sixth switch SW06 is in the on state. At this time, the switches Sw1 and Sw4 are in the off state, and the switches Sw2 and Sw3 are in the off state. The other cascaded NMOS transistors Qn4 and Qn6 function as input transistors of the current mirror, and the cascaded NMOS transistors Qn3 and Qn5 function as output transistors of the current mirror. The drain signal of the output transistor Qn3 in the current mirror as a single-end output signal of the drive amplification stage is supplied to the gate of the grounded-source NMOS transistor Qn7 of the output amplification stage via the switch Sw3 in the on state.

In the second selection sample mode Smp_Md2, when an input signal of the high voltage level is supplied via the second switch SW02 in the on state to the second input terminal In2 of the gate of the other NMOS differential transistor Qn2, and the drain voltage of the other NMOS differential transistor Qn2 decreases. The drain voltage of the NMOS differential transistor Qn1 rises. Therefore, the conduction degree of the other grounded-gate PMOS amplification transistor Qp4 increases, and the conduction degree of the grounded-gate amplifier PMOS amplification transistor Qp3 decreases. Therefore, the drain voltage of the output transistor Qn3 in the current mirror as a single-end output signal of the driving amplification stage rises.

As a result, as shown in the right lower part of FIG. 7, in the second selection sample mode Smp_Md2, the second input terminal In2 and the first input terminal In1 in each of the operational amplifiers OpAmp0 to OpAmp7 function as the non-inverting input terminal + and the inverting input terminal −, respectively, in each of the operational amplifiers OpAmp0 to OpAmp7.

As described above, between the first and second sample modes Smp_Md1 and Smp_Md2, the gate of the NMOS differential transistor Qn1 and the gate of the other NMOS differential transistor Qn2 in the differential input stage alternately function as the non-inverting input terminal + and that of the inverting input terminal − of each of the operational amplifiers OpAmp0 to OpAmp07. The cascaded NMOS transistors Qn3 and Qn5 and the other cascaded NMOS transistors Qn4 and Qn6 in the driving amplification stage alternately function as the pull-down transistor of the gate of the grounded-source NMOS transistor Qn7 in the output amplification switch. Further, the grounded-gate PMOS transistors Qp1 and Qp3 and the other grounded-gate PMOS transistors Qp2 and Qp4 in the drive amplification stage alternately function as gate pull-up transistors of the grounded-source NMOS transistor Qn7 in the output amplification stage. As a result, the influence of the offset voltage of each of the operational amplifiers OpAmp0 to OpAmp7 by the pairs of transistors, of the manufacturing process in the semiconductor integrated circuit can be reduced.

<<Operational Amplifier Capable of Performing High-Speed Operation>>

Figure 9:
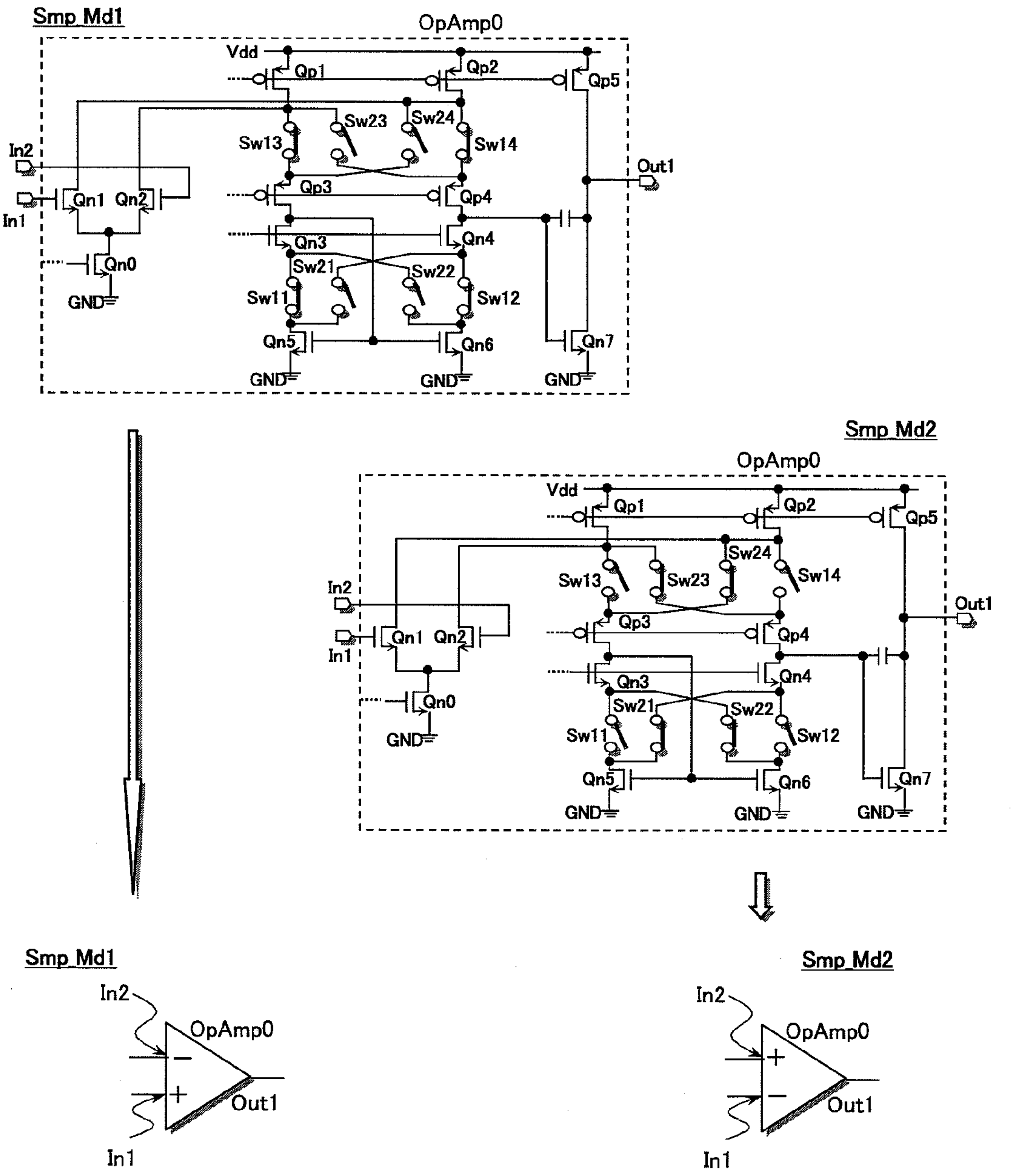
FIG. 9 is a diagram showing another configuration of the operational amplifier of each of the channels of the multiplexer illustrated in FIG. 5.

FIG. 9 is a diagram showing another configuration of the operational amplifiers OPAmp0 of the channels of the multiplexer MPX shown in FIG. 5. The operational amplifier of FIG. 9 can operate at a speed higher than the operational amplifier of FIG. 7.

In the upper and center parts of FIG. 9, the internal circuit configuration of the operational amplifier OpAmp0 is shown. The operational amplifier OpAmp0 shown in the upper and center parts of FIG. 9 is a folded cascaded operational amplifier having a high open loop voltage gain like that in FIG. 7. The operational amplifier OpAmp0 includes a differential input stage having NMOS differential transistors Qn1 and Qn2 responding to the differential input signal of the first and second input terminals In1 and In2, and the NMOS current source transistor Qn0. A drain differential output signal of the NMOS differential transistors Qn1 and Qn2 in the differential input stage is supplied to the source of each of the grounded-gate PMOS amplification transistors Qp3 and Qp4 in the drive amplification stage via switches Sw13, Sw23, Sw24, and Sw14. Between the drains of the NMOS amplification transistors Qn1 and Qn2 and the power source voltage Vdd, grounded-gate PMOS bias transistors Qp1 and Qp2 of high impedance are coupled. The drains of the grounded-gate PMOS amplification transistors Qp3 and Qp4 are coupled to the drains of the grounded-gate NMOS amplification transistors Qn3 and Qn4. The sources of the grounded-gate NMOS amplification transistors Qn3 and Qn4 are coupled to the drains of the NMOS transistors Qn5 and Qn6 via the switches Sw11, Sw21, Sw22, and Sw12.

As shown in the upper part of FIG. 9, in the first half of the selecting operation Smp of the first selection sample mode Smp_Md1, between the drains of the NMOS differential transistors Qn1 and Qn2 and the sources of the grounded-gate PMOS amplification transistors Qp3 and Qp4, the switches Sw13 and Sw14 are in the on state, and the switches Sw23 and Sw24 are in the off state. Therefore, a drain signal of the NMOS differential transistor Qn1 is supplied to the source of the grounded gate PMOS amplification transistor Qp4 via the switch Sw14. A drain signal of the NMOS differential transistor Qn2 is supplied to the source of the grounded gate PMOS amplification transistor Qp3 via the switch Sw13. As a result, the drain signal of the NMOS differential transistor Qn1 is supplied to the drain of the grounded-gate NMOS amplification transistor Qn4 via the switch Sw14 and the grounded-gate PMOS amplification transistor Qp4. The drain signal of the NMOS differential transistor Qn2 is supplied to the drain of the grounded-gate NMOS amplification transistor Qn3 via the switch Sw13 and the grounded-gate PMOS amplification transistor Qp3.

At this time, between the sources of the grounded-gate NMOS amplification transistors Qn3 and Qn4 and the drains of the NMOS transistors Qn5 and Qn6, the switches Sw11 and Sw12 are in the on state, and the switches Sw21 and Sw22 are in the off state. Therefore, the cascaded NMOS transistors Qn3 and Qn5 function as input transistors of the current mirror, and the other cascaded NMOS transistors Qn4 and Qn6 function as output transistors of the current mirror. The drain signal of the output transistor Qn4 in the current mirror as a single-end output signal of the drive amplification stage is supplied to the gate of the grounded-source NMOS transistor Qn7 of the output amplification stage. Between the drain of the grounded-source NMOS transistor Qn7 in the output amplification stage and the power source voltage Vdd, the PMOS load transistor Qp5 of high impedance is coupled.

In the first selection sample mode Smp_Md1, when an input signal of the high voltage level is supplied to the first input terminal In1 of the gate of the NMOS differential transistor Qn1, the drain voltage of the other NMOS differential transistor Qn2 rises. Therefore, the conduction degree of the grounded-gate PMOS amplification transistor Qp3 in the drive amplification stage increases, and the conduction degree of the other grounded-gate amplifier PMOS amplification transistor Qp4 decreases. Therefore, the drain voltage of the output transistor Qn4 in the current mirror as a single-end output signal of the driving amplification stage drops. The drain of the grounded-source NMOS transistor Qn7 in the output amplification stage rises.

As a result, as shown in the lower left part of FIG. 9, in the first selection sample mode Smp_Md1, the first input terminal In1 and the second input terminal In2 in each of the operational amplifiers OpAmp0 to OpAmp7 function as the non-inverting input terminal + and the inverting input terminal –, respectively, in each of the operational amplifiers OpAmp0 to OpAmp7.

As shown in the center part of FIG. 9, in the first half of the selecting operation Smp of the second selection sample mode Smp_Md2, between the drains of the NMOS differential transistors Qn1 and Qn2 and the sources of the grounded-gate PMOS amplification transistors Qp3 and Qp4, the switches Sw13 and Sw14 are in the off state and the switches Sw23 and Sw24 are in the on state. Therefore, the drain signal of the NMOS differential transistor Qn1 is supplied to the source of the grounded-gate PMOS amplification transistor Qp3 via the switch Sw24. The drain signal of the NMOS differential transistor Qn2 is supplied to the source of the grounded-gate PMOS amplification transistor Qp4 via the switch Sw23. As a result, the drain signal of the NMOS differential transistor Qn1 is supplied to the drain of the grounded-gate NMOS amplification transistor Qn3 via the switch Sw24 and the grounded-gate PMOS amplification transistor Qp3. The drain signal of the NMOS differential transistor Qn2 is supplied to the drain of the grounded-gate NMOS amplification transistor Qn4 via the switch Sw23 and the grounded-gate PMOS amplification transistor Qp4.

At this time, between the sources of the grounded-gate NMOS amplification transistors Qn3 and Qn4 and the drains of the NMOS transistors Qn5 and Qn6, the switches Sw11 and Sw12 are in the off state, and the switches Sw21 and Sw22 are in the on state. Therefore, the cascaded NMOS transistors Qn3 and Qn6 function as input transistors in the current mirror. The other cascaded NMOS transistors Qn4 and Qn5 function as output transistors in the current mirror. The drain signal of the output transistor Qn4 in the current mirror as a single-end output signal of the drive amplification stage is supplied to the gate of the grounded-source NMOS transistor Qn7 of the output amplification stage.

In the second selection sample mode Smp_Md1, when an input signal of the high voltage level is supplied to the first input terminal In1 of the gate of the other NMOS differential transistor Qn1, the drain voltage of the other NMOS differential transistor Qn2 rises. Therefore, the conduction degree of the grounded-gate PMOS amplification transistor Qp4 in the driving amplification stage increases, and the conduction degree of the other grounded-gate amplifier PMOS amplification transistor Qp3 decreases. Therefore, the drain voltage of the output transistor Qn4 in the current mirror as a single-end output signal of the driving amplification stage rises. The drain of the source-grounded NMOS transistor Qn7 of the output amplification stage decreases.

As a result, as shown in the right lower part of FIG. 9, in the second selection sample mode Smp_Md2, the first input terminal In1 and the second input terminal In2 in each of the operational amplifiers OpAmp0 to OpAmp7 function as the inverting input terminal – and the non-inverting input terminal +, respectively, in each of the operational amplifiers OpAmp0 to OpAmp7.

<<Rail-to-Rail Operational Amplifier Including gm Control Circuit>>

FIG. 10 is a diagram showing further another configuration of the operational amplifiers OPAmp0 . . . , and OPAmp7 in the channels of the multiplexer MPX illustrated in FIG. 5. The operational amplifier of FIG. 10 includes a rail-to-rail differential input circuit whose input voltage permissible range is a wide range from the ground voltage GND to the power source voltage Vdd. The operational amplifier of FIG. 10 includes a PMOS differential input circuit suitable for processing low-level input voltage close to the ground voltage GND and an NMOS differential input circuit suitable for processing high-level input voltage close to the power source voltage Vdd.

The PMOS differential input circuit for processing the low-level input voltage is configured by the PMOS transistors Qp11 and Qp12 whose gates are coupled to the first input terminal In1 and the second input terminal In2, respectively, and the PMOS current source transistor Qp10. The NMOS differential input circuit for processing the high-level input voltage is configured by NMOS transistors Qn1 and Qn2 whose gates are coupled to the first input terminal In1 and the second input terminal In2, respectively, and the NMOS current source transistor Qn0. Like in the operational amplifier of FIG. 9, the drain signal of the NMOS differential transistor Qn1 of the NMOS differential input circuit of the operational amplifier of FIG. 10 is supplied to the grounded-gate PMOS bias transistor Qp2 and the switches Sw14 and Sw24. Like in the operational amplifier of FIG. 9, the drain signal of the other NMOS differential transistor Qn2 of the NMOS differential input circuit of the operational amplifier of FIG. 10 is supplied to the grounded-gate PMOS bias transistor Qp1 and the switches Sw13 and Sw23.

Further, the drain signal of the PMOS differential transistor Qp11 of the PMOS differential input circuit of the operational amplifier of FIG. 10 is supplied to the grounded-source NMOS transistor Qn6 and the switches Sw12 and Sw22. The drain signal of the other PMOS differential transistor Qp12 of the PMOS differential input circuit of the operational amplifier of FIG. 10 is supplied to the grounded-source NMOS transistor Qn5 and the switches Sw11 and Sw21.

Like in FIG. 9, in the operational amplifier of FIG. 10, the drain differential output signals of the NMOS differential transistors Qn1 and Qn2 of the differential input stage are supplied to the sources of the grounded-gate PMOS amplification transistors Qp3 and Qp4 of the drive amplification stage via the switches Sw13, Sw23, Sw24, and Sw14. Further, in the operational amplifier of FIG. 10, the drain differential output signals of the PMOS differential transistors Qp11 and Qp12 of the differential input stage are supplied to the sources of the grounded-gate NMOS amplification transistors Qn3 and Qn4 of the drive amplification stage via the switches Sw11, Sw21, Sw22, and Sw12.

Further, in the operational amplifier of FIG. 10, the drain signal of the output transistor Qn4 in the NMOS current mirror as a single-end output signal of the drive amplification stage is supplied to the gate of the grounded-source NMOS transistor Qn7 on the ground voltage GND side of the output amplification stage. The drain signal of the PMOS transistor Qp4 as the other single-end output signal of the drive amplification stage is supplied to the gate of the grounded-source PMOS transistor Qp5 on the power source voltage Vdd side of the output amplification stage. The drain of the grounded-source NMOS transistor Qn7 on the ground voltage GND side of the output amplification stage and the drain of the grounded-source PMOS transistor Qp5 on the power source voltage Vdd side are coupled to an output terminal Out1 of the operational amplifier OpAmp0.

In the drive amplification stage of the operational amplifier of FIG. 10, between the drains of the grounded-gate PMOS amplification transistors Qp3 and Qp4 and the drains of the grounded-gate NMOS amplification transistors Qn3 and Qn4, a source/drain current path of the other grounded-gate PMOS amplification transistors Qp6 and Qp7 is coupled.

In particular, the operational amplifier of FIG. 10 includes a gm control circuit Gm_Cnt for making mutual conductance gm of the rail-to-rail differential input circuit constant. The gm control circuit Gm_Cnt in FIG. 10 is configured in a manner similar to the gm control circuit described in the non-patent document 5. The current gm control circuit Gm_Cnt has a switch P-channel MOS transistor Qp13, a current switch N-channel MOS transistor Qn13, current-mirror N-channel MOS transistors Qn10 and Qn11, and current-mirror P-channel MOS transistors Qp15 and Qp14.

A pair of P-channel differential MOS transistors Qp11 and QP12 generate high-level common-mode voltages $V_{CP}$ in the common source from differential input signals from the first input terminal In1 and the second input terminal In2. The high-level common-mode voltage $V_{CP}$ in the common source of the PMOS differential MOS transistors Qp11 and Qp12 is supplied to the source of the current switch P-channel MOS transistor Qp13 having a gate to which DC bias voltage $V_{BB}$ is supplied. By the current mirror NMOS transistors Qn10 and Qn11 coupled to the drain of the current switch PMOS Q13, the bias currents of the sources of the NMOS transistors Qn1 and Qn2 is controlled in proportional to the drain current of the current switch PMOS transistor Qp13. The voltage level of the DC bias voltage $V_{BB}$ is set to about Vdd/2 of an almost intermediate value between the source voltage Vdd and the ground voltage GND.

The pair of N-channel differential MOS transistors Qn1 and Qn2 generate low-level common-mode voltage $V_{CN}$ at the common source from the differential input signals of the first and second input terminals In1 and In2. The low-level common-mode voltage $V_{CN}$ at the common source of the NMOS differential MOS transistors Qn1 and Qn2 is supplied to the source of the current switch N-channel MOS transistor Qn13 having a gate to which the DC bias voltage $V_{BB}$ is supplied. By the current mirror P-channel MOS transistors Qp15 and Qp14 coupled to the drain Qn13 of the current switch NMOS, the bias current of the sources of the PMOS differential transistors Qp11 and Qp12 is controlled in proportional to the drain current of the current switch NMOS transistor Qn13.

<<Operation of gm Control Circuit>>

Figure 11:
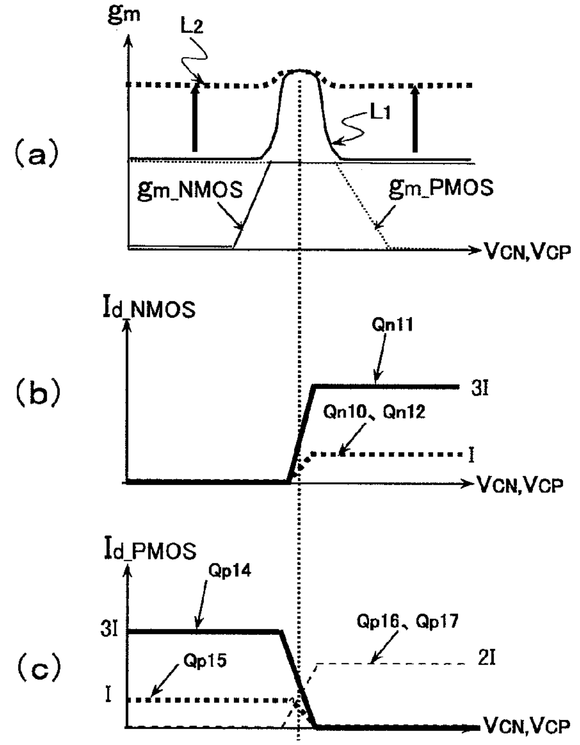
FIGS. 11A to 11C are diagrams for explaining operation of a "gm" control circuit coupled to a differential input circuit for making the mutual conductance of the rail-to-rail differential input circuit in the operational amplifier FIG. 10 constant.

FIGS. 11A to 11C are diagrams for explaining the operation of the gm control circuit Gm_Cnt coupled to the differential input circuit for making mutual conductance "gm" of a rail-to-rail differential input circuit in the operational amplifier of FIG. 10 constant.

In an operation region in which an input signal of the rail-to-rail differential input circuit to which the gm control circuit Gm_Cnt for making the mutual conductance "gm" constant is not coupled is at the low level, only a P-channel MOS differential transistor operates. In an operation region in which an input signal is at an intermediate level, both the P-channel MOS differential transistor and the N-channel MOS differential transistor operate. Further, in an operation region in which an input signal is at the high level, only an N-channel MOS differential transistor operates.

Therefore, as shown in FIG. 11A, in the operation region in which the common-mode voltages $V_{CP}$ and $V_{CN}$ of the rail-to-rail differential input circuit are at the low level, only mutual conductance gm_PMOS of the PMOS differential transistor has a high value. In the operation region in which the common-mode voltages $V_{CP}$ and $V_{CN}$ of the differential input circuit are at the high level, only mutual conductance gm_NMOS of the NMOS differential transistor has a high value. Further, in the operation region in which the common-mode voltages $V_{CP}$ and $V_{CN}$ of the differential input circuit are at the intermediate level, the mutual conductance gm_PMOS of the PMOS differential transistor and the mutual conductance gm_NMOS of the NMOS differential transistor have high values. Therefore, the total mutual conductance between the PMOS differential transistor and the NMOS differential transistor which are coupled in parallel with the differential input signal have a large value in the operation region of the intermediate level as shown by a characteristic L1 in FIG. 11A, and have a small value in the low-level operation region and the high-level operation region.

In the operational amplifier of FIG. 10, the gm control circuit Gm_Cont for making the mutual conductance gm of the rail-to-rail differential input circuit constant is coupled to the differential input circuit.

In the operation region in which the common-mode voltages $V_{CP}$ and $V_{CN}$ of the differential input circuit are at the high level, the current switch P-channel MOS transistor Qp13 of the gm control circuit Gm_Cnt is turned on. By the turn-on of the current switch PMOS transistor Qp13, constant current Iref of the PMOS current source transistor Qp10 supplied to the PMOS differential transistors Qp11 and Qp12 flows to the current switch PMOS Qp13. Therefore, by the NMOS transistors Qn10 and Qn11 of a current mirror ratio 1:3 coupled to the drain of the current switch PMOS transistor Qp13, the bias current of the NMOS differential transistors Qn1 and Qn2 increases in proportional to the constant current Iref of the drain of the current switch PMOS transistor Qp13. In the operation region in which the common mode voltage is at the low level, the current switch PMOS transistor Qp13 is in the off state, and the bias current of the NMOS differential transistors Qn1 and Qn2 is only the constant current Iref of the current source NMOS transistor Qn0. In the operation region in which the common mode voltage is at the high level, as described above, the current switch PMOS transistor Qp13 is in the on state and, as shown in FIG. 11B, constant current 3Iref of the NMOS output transistor Qn11 in the current mirror is added to the bias current of the NMOS differential transistors Qn1 and Qn2. Therefore, total bias current of the NMOS differential transistors Qn1 and Qn2 is the sum 4Iref of the constant current Iref of the current source NMOS transistor Qn0 and the constant current 3Iref of the NMOS output transistor Qn11 of the current mirror. As well known, the mutual conductance gm of the MOS transistor is in proportional to the square root of the operation current. The mutual conductance gm_NMOS of the NMOS differential transistors Qn1 and Qn2 in this state is, as shown by the characteristic L2 in FIG. 11A, about twice as large as the value indicated by the characteristic L1 of FIG. 11A. In the operation region in which the common mode voltage is at the high level, by the NMOS transistors Qn10 and Qn12 having a current mirror ratio 1:1 and coupled to the drain of the current switch PMOS Qp13, bias current is passed to the PMOS load transistors Qp16 and Qp17 of the NMOS differential transistors Qn1 and Qn2. The bias current of the PMOS load transistors Qp16 and Qp17 is determined by the source/gate voltage of the diode-couple PMOS transistor Qp18 generated by the constant current Iref of the NMOS output transistor Qn12 via the current mirror. In the operation region where the common mode voltage is at the low level, the NMOS differential transistors Qn1 and Qn2 are inactive. By interrupting the bias current of the PMOS load transistors Q16 and Q17 of the NMOS differential transistors Qn1 and Qn2, the operation of low-power consumption can be performed.

In the operation region in which the common-mode voltages $V_{CP}$ and $V_{CN}$ of the differential input circuit are at the low level, the current switch N-channel MOS transistor Qn13 of the gm control circuit Gm_Cnt is turned on. By the turn-on of the current switch NMOS transistor Qn13, constant current Iref of the NMOS current source transistor Qn0 supplied to the NMOS differential transistors Qn1 and Qn2 flows to the current switch NMOS Qp13. Therefore, by the PMOS transistors Qp15 and Qp14 of a current mirror ratio 1:3 coupled to the drain of the current switch NMOS transistor Qn13, the bias current of the PMOS differential transistors Qp11 and Qp12 increases in proportional to the constant current Iref of the drain of the current switch PMOS transistor Qn13. In the operation region in which the common mode voltage is at the high level, the current switch NMOS transistor Qn13 is in the off state, and the bias current of the PMOS differential transistors Qp11 and Qp12 is only the constant current Iref of the current source PMOS transistor Qn10. In the operation region in which the common mode voltage is at the low level, as described above, the current switch NMOS transistor Qn13 is in the on state and, as shown in FIG. 11C, constant current 3Iref of the PMOS output transistor Qp14 in the current mirror is added to the bias current of the PMOS differential transistors Qp11 and Qp12. Therefore, total bias current of the PMOS differential transistors Qp11 and Qp12 is the sum 4Iref of the constant current Iref of the current source PMOS transistor Qn10 and the constant current 3Iref of the PMOS output transistor Qp14 of the current mirror. As well known, the mutual conductance gm of the MOS transistor is in proportional to the square root of the operation current. The mutual conductance gm_PMOS of the PMOS differential transistors Qp11 and Qp12 in this state is, as shown by the characteristic L2 in FIG. 11A, about twice as large as the value indicated by the characteristic L1 of FIG. 11A.

<<Switch Control of Operational Amplifiers in Channels of Multiplexer>>

Figure 12:
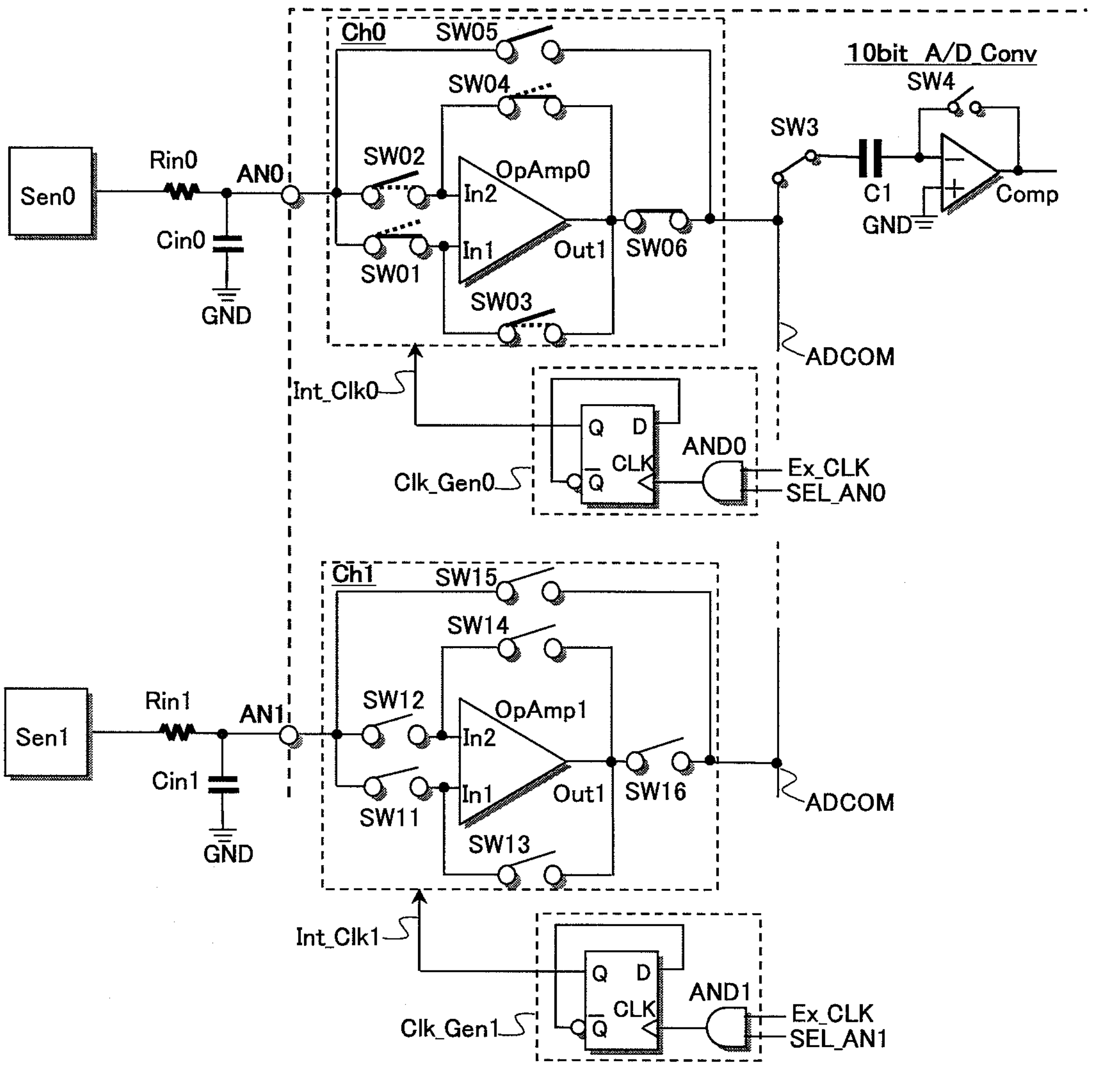
FIG. 12 is a diagram showing the configuration of a clock generator for generating a switch control internal clock signal for on/off controlling first to sixth switches in the operational amplifier of each of the channels of the multiplexer illustrated in FIG. 5.

FIG. 12 is a diagram showing the configuration of clock generators Glk_Gen0, Glk_Gen1, . . . , and Glk_Gen7 for generating switch control start clock signals for on/off controlling the first switch SW01 . . . , and 71 to the six switch SW06 . . . , and 76 of the operational amplifiers OpAmp0 . . . , and OpAmp7 of the channels in the multiplexer MPX illustrated in FIG. 5.

Switch control start clock signals Int_Clk0, Int_Clk1, . . . , and Int_Clk7 for on/off controlling the first switch SW01 to the sixth switch SW06 of the operational amplifiers OpAmp0 . . . , and OpAmp7 are generated from a non-inverting output terminal Q of a flip flop of counters of start clock generators Glk_Gen0, Glk_Gen1, and Glk_Gen7 A data input terminal D of the flip flop is coupled to an inverting output terminal /Q of the flip flop, and clock terminals CLK of the flip flops are coupled to output terminals of AND circuits AND0 and AND1. An external clock signal Ex_CLK having an almost constant frequency is commonly supplied to the input terminal of one of the AND circuits AND0 and AND1, and channel selection signals SEL_An0 and SEL_AN1 of the multiplexer MPX are supplied to the input terminal of the other one of the AND circuits AND0 and AND1.

The flip flops of the start clock generators Glk_Gen0, Glk_Gen1, . . . , and Glk_Gen7 of the channels of the multiplexer MPX selected by the channel selection signal generates a switch control start clock signal Int_Clk0 responding to the external clock signal Ex_CLK. In response to the switch control start clock signal Int_Clk0, an internal clock generating circuit (not shown) of the selection channel Ch0 in the multiplexer MPX generates switch internal control signals for on/off controlling the first switch SW01 to the sixth switch SW06 of the operational amplifier OpAmp0 of the selected channel. The count value of the counter of the start clock generators Glk_Gen0, Glk_Gen1, . . . , and Glk_Gen7 is set to, for example, 10.

Figure 13:
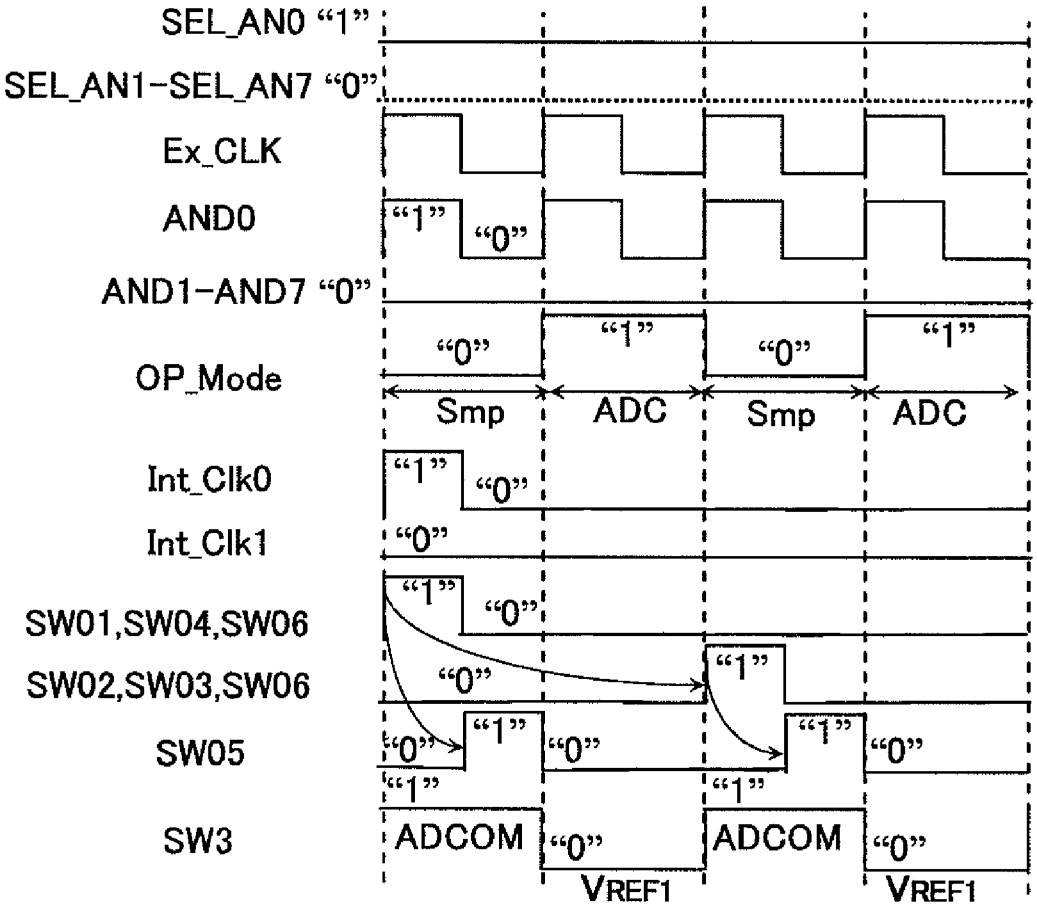
FIG. 13 is a diagram for explaining operation of a clock generator shown in FIG. 12.

FIG. 13 is a diagram for explaining the operation of the clock generators Glk_Gen0, Glk_Gen1, . . . , and Glk_Gen7 shown in FIG. 12.

In the example shown in FIG. 13, the zero channel AN0 in the multiplexer MPX is selected and the other channels AN1 to AN7 are not selected. The channel selection signal SEL_AN0 is set to the high level “1”, and the other channel selection signals SEL_AN1 . . . , and SEL_AN7 are set to the low level “0”. In response to repetition of the high level “1” and the low level “0” of the external clock signal Ex_CLK, repetitive clock signals of the high level “1” and the low level “0” are generated from the output terminal of the AND circuit AND0 of the zero channel AN0. However, output signals of the AND circuits AND1 . . . , and AND7 of the other channels AN1 . . . , and AN7 are maintained at the low level “0”.

The counter of the zero channel AN0 counts the repetitive clock signals output from the AND circuit AND0 of the zero channel AN0. The counting operation of the first time is the operation Smp of selecting an analog input signal of the zero channel of the multiplexer MPX. The selecting operation Smp at this time is in the first selection sample mode Smp_Md1 described in FIGS. 8A to 8C. In the first half of the counting operation of the first time, the switch control start clock signal Int_Clk0 of the high level “1” is generated. The internal clock generating circuit of the selected channel Ch0 of the multiplexer MPX generates switch internal control signals SW01, SW04, and SW06 for turning on the first switch SW01, the fourth switch SW04, and the sixth switch SW06, respectively. Simultaneously, the internal clock generating circuit of the selected channel Ch0 of the multiplexer MPX generates switch internal control signals SW02 and SW03 for turning off the second switch SW02 and the third switch SW03, respectively. At the same time, the internal clock generating circuit generates a switch internal control signal SW05 for turning off the fifth switch SW05.

In the latter half of the counting operation of the first time, the internal clock generating circuit generates the switch internal control signals SW01, SW04, and SW06 for turning off the first switch SW01, the fourth switch SW04, and the sixth switch SW06, respectively. Simultaneously, the internal clock generating circuit generates a switch internal control signal SW05 for turning on the fifth switch SW05. In the first and latter halves of the counting operation of the first time, the internal clock generating circuit of the zero channel of the multiplexer MPX controls the switch SW3 to be on. The switch SW3 is provided for supplying the analog output terminal ADCOM of the multiplexer to one end of the sampling capacitor C1 of the 10-bit successive-approximation A/D converter.

A counting operation of the second time is an A/D converting operation ADC for converting an analog input signal voltage sampled by the operation Smp of selecting the analog input signal of the zero channel as the counting operation of the first time to a digital signal. The A/D converting operation ADC is executed by supplying a reference voltage $V_{REF1}$ to the sampling capacitor C1 of the input of the comparator Comp of the 10-bit successive-approximation A/D converter of FIG. 5 via the switch SW3.

A counting operation of the third time is also the operation Smp of selecting the analog input signal of the zero channel of the multiplexer MPX. The selecting operation Smp at this time is in the second selection sample mode Smp_Md2 described with reference to FIGS. 8A to 8C. In response to the switch control start clock signal Int_Clk0 of the counting operation of the first time, the internal clock generating circuit of the selected channel Ch0 of the multiplexer MPX generates the switch internal control signals SW02, SW03, and SW06 for turning on the second switch SW02, the third switch SW03, and the sixth switch SW06. Simultaneously, the internal clock generating circuit of the selected channel Ch0 of the multiplexer MPX generates the switch internal control signals SW02 and SW04 for turning off the second switch SW02 and the third switch SW03. At the same time, the internal clock generating circuit generates a switch internal control signal SW05 for turning of the fifth switch SW05.

In the latter half of the counting operation of the third time, the internal clock generating circuit generates the switch internal control signals SW02, SW03, and SW06 for turning off the second switch SW02, the third switch SW03, and the sixth switch SW06, respectively. Simultaneously, the internal clock generating circuit generates the switch internal control signal SW05 for turning on the fifth switch SW05. In the first and latter halves of the counting operation of the third time, the internal clock generating circuit of the zero channel of the multiplexer MPX controls the switch SW3 to be on. The switch SW3 is provided for supplying the analog output terminal ADCOM of the multiplexer to one end of the sampling capacitor C1 of the 10-bit successive-approximation A/D converter.

Figure 2:
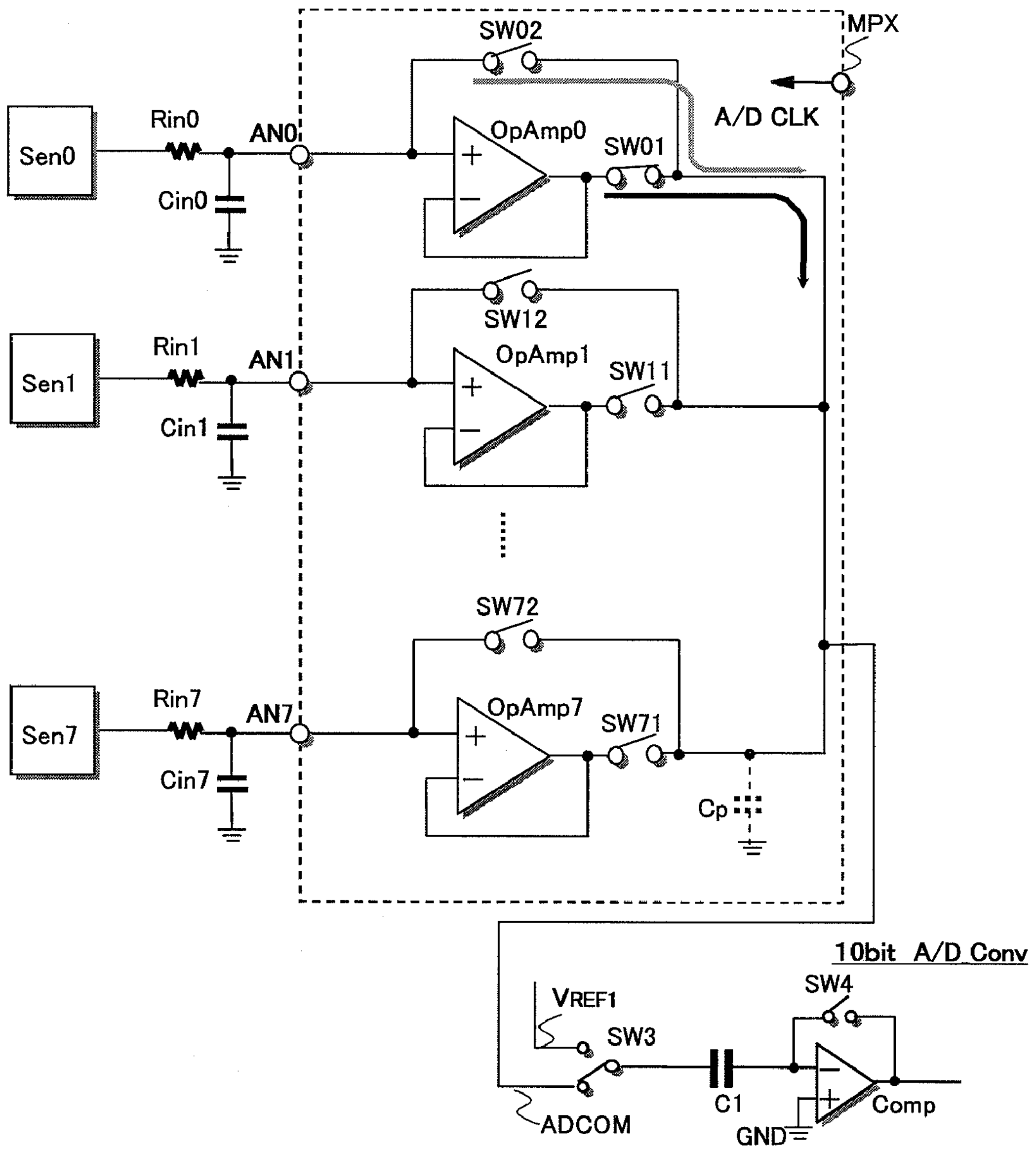
FIG. 2 is a diagram showing an internal configuration of a multiplexer in a monolithic semiconductor integrated circuit and external circuits coupled to analog input terminals of the multiplexer examined by the inventors of the present invention prior to the present invention shown in FIG. 1.
Figure 3:
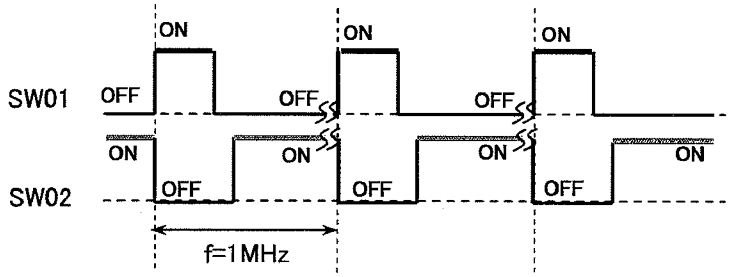
FIG. 3 is a diagram for explaining the operation of selecting an analog input signal in a selection sample mode of the multiplexer illustrated in FIG. 2.
Figure 4:
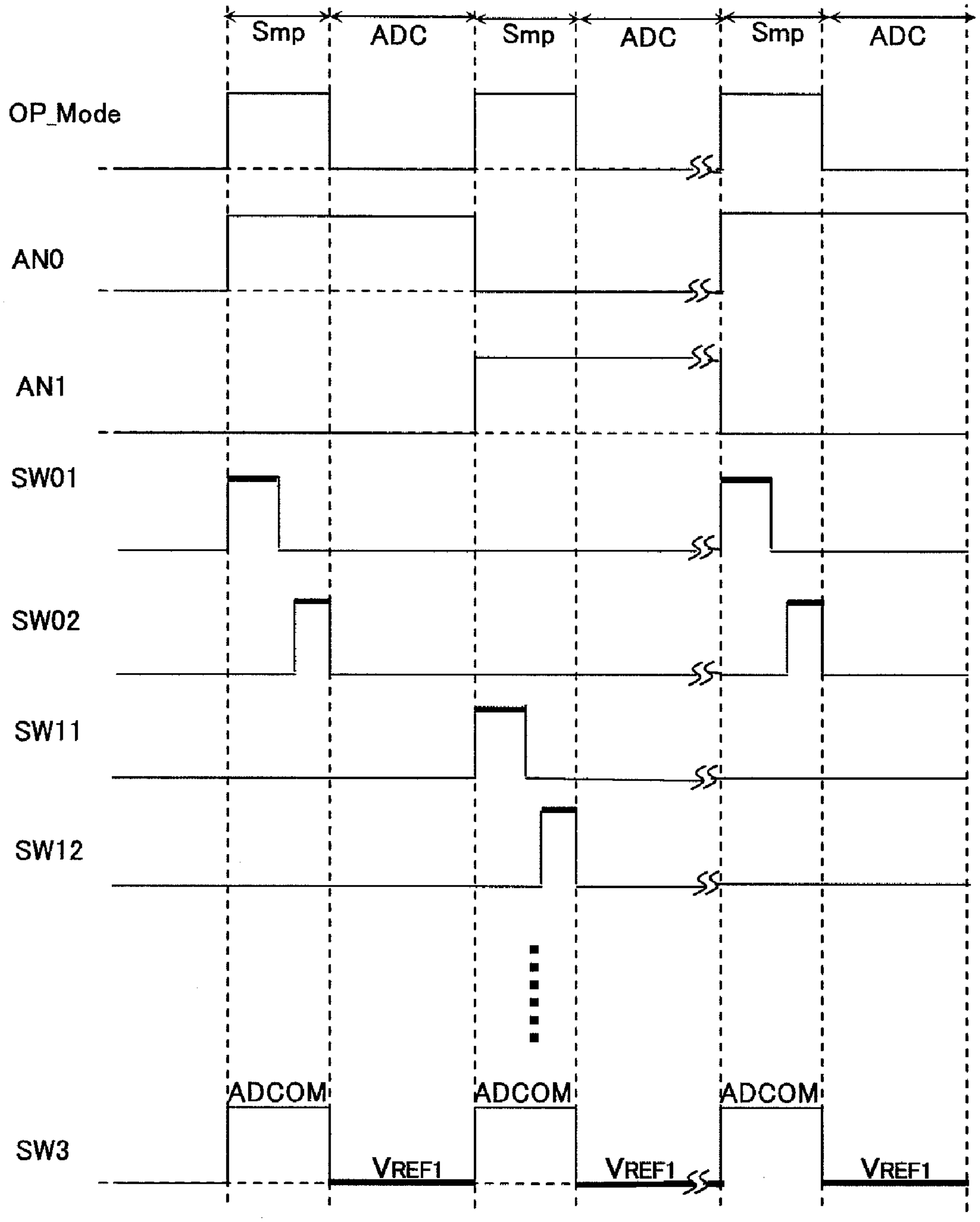
FIG. 4 is a diagram for explaining operation of repeating operation of selecting the analog input signal in the selection sample mode of the multiplexer shown in FIG. 2 and operation of A/D converting the analog input signal in the conversion mode by the 10-bit successive-approximation-type A/D converter of FIG. 2.

A counting operation of the fourth time is an A/D converting operation ADC for converting an analog input signal voltage sampled by the operation Smp of selecting the analog input signal of the zero channel as the counting operation of the third time to a digital signal. The A/D converting operation ADC is executed by supplying the reference voltage $V_{REF1}$ to the sampling capacitor C1 of the input of the comparator Comp of the 10-bit successive-approximation A/D converter of FIG. 2 via the switch SW3 as described above.

The operation is repeated and the count value of the start clock generator Glk_Gen0 of the zero channel An0 of the multiplexer MPX reaches 10. The channel selection signal SEL_AN0 of the zero channel AN0 is set to the low level “0”, the channel selection signal SEL_AN1 of the next 1-channel AN1 is set to the high level “1”, and the operation Smp of selecting the analog input signal of one channel and the A/D converting operation ADC are repeated. When the count value of the start clock generator Glk_Gen1 of the 1-channel AN1 of the multiplexer MPX reaches 10, the channel selection signal SEL_AN1 of the 1-channel AN1 is set to the low level “0”, and the following 2-channel selection signal SEL_AN2 is set to the high level “1”.

<<Operational Amplifier Shared by Plural Channels of Multiplexer>>

FIG. 14 is a diagram showing another internal configuration of the multiplexer MPX of the monolithic integrated circuit as an embodiment of the present invention shown in FIG. 1. The internal configuration of the multiplexer MPX of FIG. 14 is different from that of the multiplexer MPX of FIG. 5 with respect to that one operational amplifier is shared by a plurality of channels in FIG. 14. External circuits coupled to the analog input terminals of the multiplexer MPX of FIG. 14 are the same as those of FIG. 5.

Specifically, in FIG. 14, the zero channel AN0 and the 1-channel AN1 of the multiplexer MPX share one operational amplifier OpAmp0, the third switch SW03, the fourth switch SW04, and the fifth switch SW05. However, the zero channel AN0 of the multiplexer MPX has the dedicated first switch SW01, second switch SW02, and fifth switch SW05. Similarly, the 1-channel AN1 of the multiplexer MPX has the dedicated first switch SW11, second switch SW12, and fifth switch SW01. Similarly, the zero channel AN0 and the 1-channel AN1 of the multiplexer MPX share one operational amplifier OpAmp3, a third switch SW33, a fourth switch SW34, and a fifth switch SW35. However, the 6-channel AN6 of the multiplexer MPX has the dedicated first switch SW61, second switch SW62, and fifth switch SW65. Similarly, the 7-channel AN7 of the multiplexer MPX has the dedicated first switch SW71, second switch SW72, and fifth switch SW71. In the multiplexer MPX of FIG. 14, each of the operational amplifiers OpAmp0 and OpAmp3 may be configured by the operational amplifier in the internal circuit shown in any of FIGS. 7, 9, and 10.

As described above, in the multiplexer MPX shown in FIG. 14, by the plural channels AN0 and AN1, one operational amplifier OpAmp0, the third switch SW0, the fourth switch SW04, and the fifth switch SW05 are shared. Therefore, by employing the multiplexer MPX shown in FIG. 14, the chip occupation area of the multiplexer in the monolithic integrated circuit can be reduced.

Figure 15:
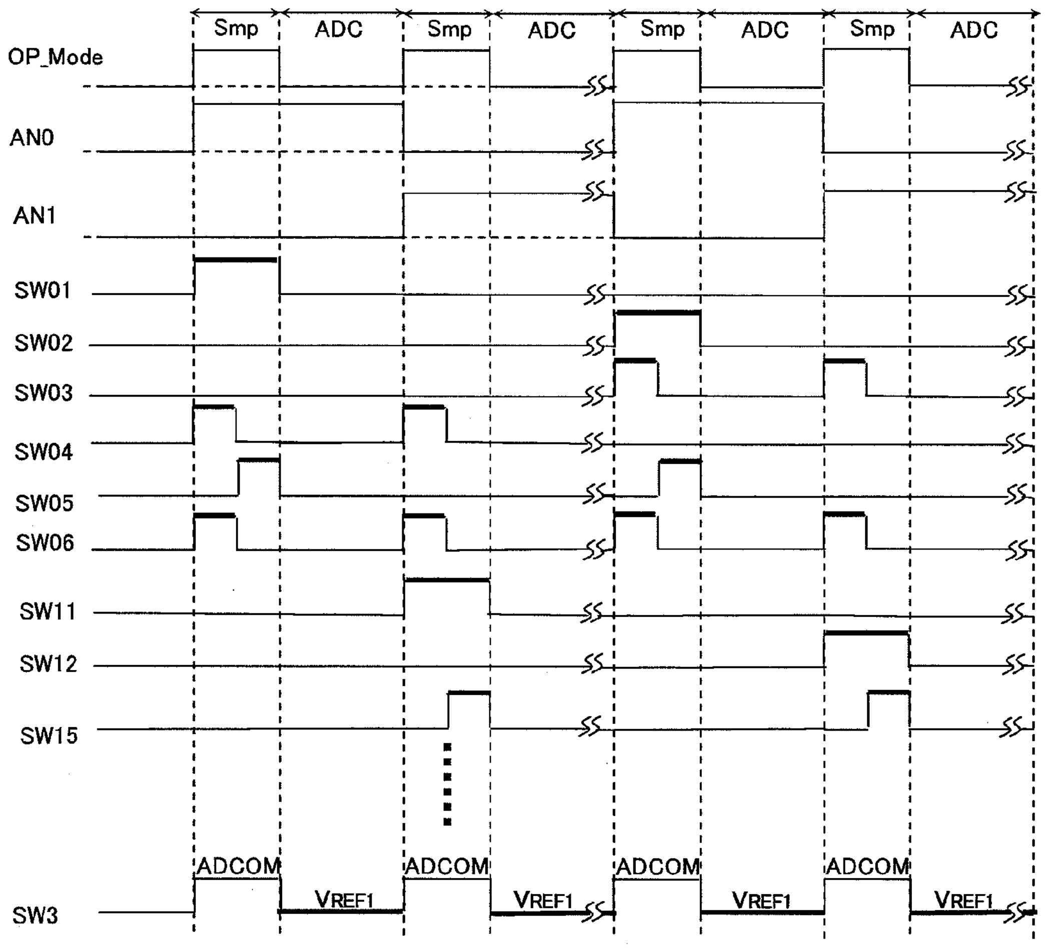
FIG. 15 is a diagram for explaining operation of repeating operation of selecting the analog input signal in the selection sample mode of the multiplexer of an operational amplifier sharing type of FIG. 14 and operation of A/D converting the analog input signal in the conversion mode by the successive-approximation-type A/D converter.

FIG. 15 is a diagram for explaining the operation of repeating the operation Smp of selecting the analog input signal in the selection sample mode by the multiplexer of the operational amplifier sharing type of FIG. 14 and the A/D converting operation ADC of the analog input signal in the conversion mode by the successive-approximation-type A/D converter.

A counting operation of the first time shown in FIG. 15 is the operation Smp of selecting the analog input signal of the zero channel AN0 of the multiplexer MPX. In the selecting operation Smp at this time, the analog input signal of the zero channel AN0 is supplied to the first input terminal In1 functioning as the non-inverting input terminal + of the operational amplifier OpAmp0 via the switch SW01. In the first half of the counting operation of the first time, the output terminal Out1 of the operational amplifier OpAmp0 is coupled to the second input terminal In2 functioning as the inverting input terminal − of the operational amplifier OpAmp0 via the switch SW04. In the first half of the counting operation of the first time, the output terminal Out1 of the operational amplifier OpAmp0 is coupled to the sampling capacitor C1 of the input of the comparator Comp of the 10-bit successive-approximation type A/D converter via the switches SW06 and SW3. In the latter half of the counting operation of the first time, the analog input signal of the zero channel AN0 is coupled to the sampling capacitor C1 of the input of the comparator Comp of the 10-bit successive-approximation type A/D converter via the switches SW05 and SW3.

A counting operation of the second time shown in FIG. 15 is an A/D converting operation ADC for converting an analog input signal voltage sampled by the operation Smp of selecting the analog input signal of the zero channel as the counting operation of the first time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation of the third time is the operation Smp of selecting the analog input signal of the 1-channel AN1 of the multiplexer MPX. In the selecting operation Smp at this time, the analog input signal of the 1-channel AN1 is supplied to the first input terminal In1 functioning as the non-inverting input terminal + of the operational amplifier OpAmp0 via the switch SW11. In the first half of the counting operation of the third time, the output terminal Out1 of the operational amplifier OpAmp0 is coupled to the second input terminal In2 functioning as the inverting input terminal − of the operational amplifier OpAmp0 via the switch SW04. In the first half of the counting operation of the third time, the output terminal Out1 of the operational amplifier OpAmp0 is coupled to the sampling capacitor C1 of the input of the comparator Comp of the 10-bit successive-approximation type A/D converter via the switches SW06 and SW3. In the latter half of the counting operation of the third time, the analog input signal of the 1-channel AN1 is coupled to the sampling capacitor C1 of the input of the comparator Comp of the 10-bit successive-approximation type A/D converter via the switches SW15 and SW3.

A counting operation of the fourth time shown in FIG. 15 is an A/D converting operation ADC for converting an analog input signal voltage sampled by the operation Smp of selecting the analog input signal of the 1-channel as the counting operation of the third time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation of the fifth time is the operation Smp of selecting the analog input signal of the zero channel AN0 of the multiplexer MPX. In the selecting operation Smp at this time, the analog input signal of the zero channel AN0 is supplied to the second input terminal In2 functioning as the non-inverting input terminal + of the operational amplifier OpAmp0 via the switch SW02. In the first half of the counting operation of the fifth time, the output terminal Out1 of the operational amplifier OpAmp0 is coupled to the first input terminal In1 functioning as the inverting input terminal − of the operational amplifier OpAmp0 via the switch SW03. In the first half of the counting operation of the fifth time, the output terminal Out1 of the operational amplifier OpAmp0 is coupled to the sampling capacitor C1 of the input of the comparator Comp of the 10-bit successive-approximation type A/D converter via the switches SW06 and SW3. In the latter half of the counting operation of the fifth time, the analog input signal of the zero channel AN0 is coupled to the sampling capacitor C1 of the input of the comparator Comp of the 10-bit successive-approximation type A/D converter via the switches SW06 and SW3.

A counting operation of the sixth time shown in FIG. 15 is an A/D converting operation ADC for converting an analog input signal voltage sampled by the operation Smp of selecting the analog input signal of the zero channel as the counting operation of the fifth time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation of the seventh time is the operation Smp of selecting the analog input signal of the 1-channel AN1 of the multiplexer MPX. In the selecting operation Smp at this time, the analog input signal of the 1-channel AN1 is supplied to the second input terminal In2 functioning as the non-inverting input terminal + of the operational amplifier OpAmp0 via the switch SW12. In the first half of the counting operation of the seventh time, the output terminal Out1 of the operational amplifier OpAmp0 is coupled to the first input terminal In1 functioning as the inverting input terminal − of the operational amplifier OpAmp0 via the switch SW03. In the first half of the counting operation of the seventh time, the output terminal Out1 of the operational amplifier OpAmp0 is coupled to the sampling capacitor C1 of the input of the comparator Comp of the 10-bit successive-approximation type A/D converter via the switches SW06 and SW3. In the latter half of the counting operation of the seventh time, the analog input signal of the 1-channel AN1 is coupled to the sampling capacitor C1 of the input of the comparator Comp of the 10-bit successive-approximation type A/D converter via the switches SW15 and SW3.

A counting operation of the eighth time shown in FIG. 15 is an A/D converting operation ADC for converting an analog input signal voltage sampled by the operation Smp of selecting the analog input signal of the 1-channel AN1 as the counting operation of the seventh time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

FIG. 16 is a diagram showing another internal configuration of the multiplexer MPX of the monolithic integrated circuit as an embodiment of the present invention illustrated in FIG. 1.

In the multiplexer MPX of FIG. 14, the zero channel AN0 and the 1-channel AN1 of the multiplexer MPX are coupled to each other via the switches SW01 and SW02 and the switches SW11 and SW12. There is consequently the possibility that crosstalk of high frequency signals becomes a problem via the parasitic capacitance between the terminals of the switches.

The multiplexer MPX of FIG. 16 includes, between the zero channel AN0 and 1-channel AN1 of the multiplexer MPX, differential input stages DA0 and DA1 dedicated to channels. However, differential output signals of the differential input stages DA0 and DA1 are supplied to differential input terminals of a single driving amplification stage/output amplification stage DR&Out shared by the zero channel AN0 and the 1-channel AN1 of the multiplexer MPX. The circuit configuration of the shared driving amplification stage/output amplification stage DR&Out of FIG. 16 is similar to that of a driving amplification stage/output amplification stage of the operational amplifier OpAmp0 shown in FIG. 10.

Figure 17:
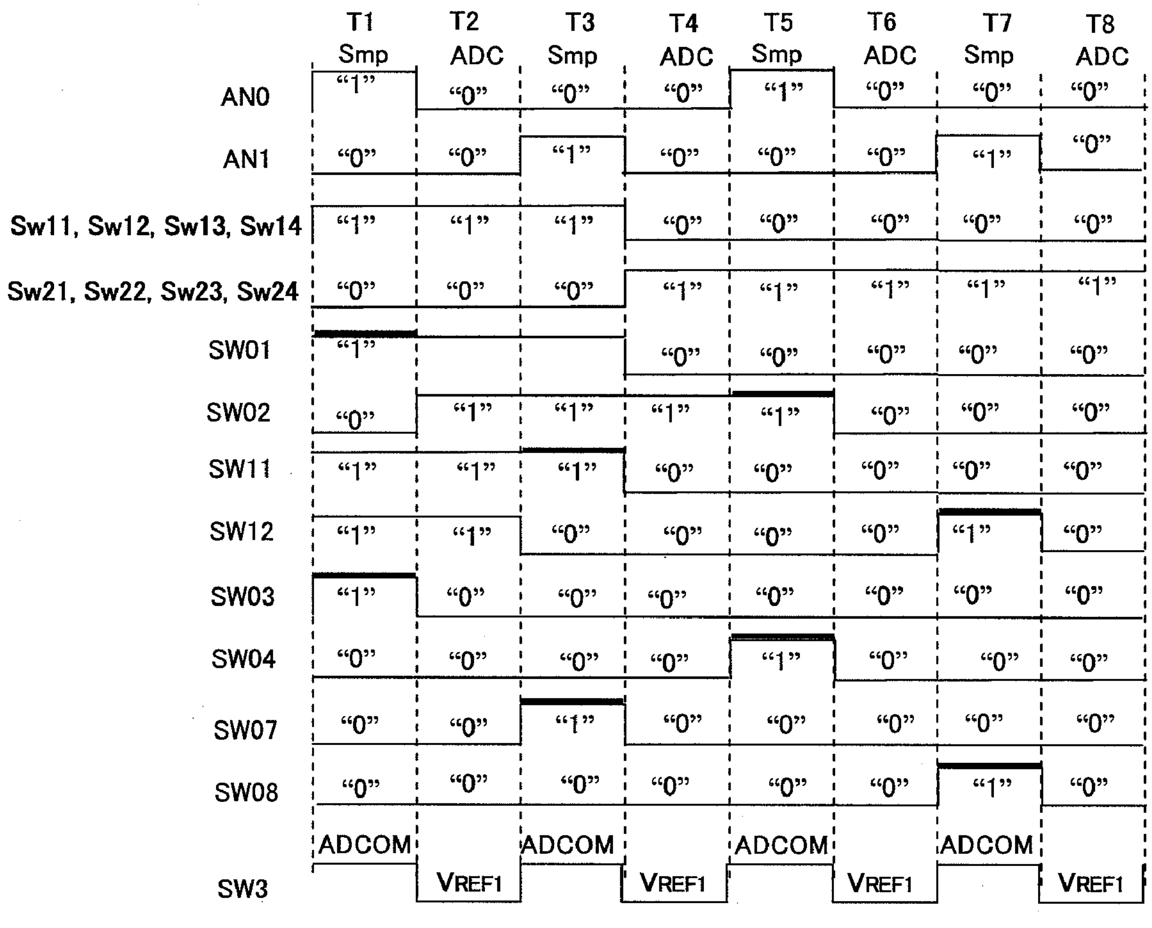
FIG. 17 is a diagram for explaining operation of repeating operation of selecting the analog input signal in the selection sample mode of the multiplexer shown in FIG. 16 and operation of A/D converting the analog input signal in the conversion mode by the 10-bit successive-approximation-type A/D converter of FIG. 5.

FIG. 17 is a diagram for explaining the operation of repeating the operation Smp of selecting the analog input signal in the selection sample mode by the multiplexer of FIG. 16 and the A/D converting operation ADC of the analog input signal in the conversion mode by the 10-bit successive-approximation-type A/D converter of FIG. 5.

A counting operation T1 of the first time shown in FIG. 17 is the operation Smp of selecting the analog input signal of the zero channel AN0 of the multiplexer MPX. Drain signals of differential NMOS transistors Qn01 and Qn02 of the differential input stage DA0 are supplied to switches Sw13, Sw23, Sw24, and Sw14 of the shared driving amplification stage/output amplification stage DR&Out and sources of the grounded-gate PMOS amplification transistors Qp3 and Qp4 via the on-state switch AN0_Sw. At this time, the switches Sw13, Sw14, Sw11, and Sw12 on the outside are controlled in the on state, and the switches Sw23, Sw24, Sw21, and Sw22 on the inside are controlled in the off state. In the selecting operation Smp at this time, the analog input signal of the zero channel AN0 is supplied to the first input terminal In1 of the differential input stage DA0 functioning as the non-inverting input terminal + of the operational amplifier OpAmp0 via the switch SW01. The output terminal Out1 of the operational amplifier OpAmp0 is coupled to the second input terminal In2 in the differential input stage DA0 functioning as the inverting input terminal − of the operational amplifier OpAmp0 via the switch SW03. In the first half of the counting operation T1 of the first time, the output terminal Out1 of the operational amplifier OpAmp0 is coupled to the sampling capacitor C1 of the input of the comparator Comp of the 10-bit successive-approximation type A/D converter via the switch SW3. In the latter half of the counting operation T1 of the first time, the analog input signal of the zero channel AN0 is coupled to the sampling capacitor C1 of the input of the comparator Comp of the 10-bit successive-approximation type A/D converter via the switches SW05 and SW3.

A counting operation T2 of the second time shown in FIG. 17 is an A/D converting operation ADC for converting an analog input signal voltage sampled by the operation Smp of selecting the analog input signal of the zero channel as the counting operation T1 of the first time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation T3 of the third time is the operation Smp of selecting the analog input signal of the 1-channel AN1 of the multiplexer MPX. Drain signals of differential NMOS transistors Qn11 and Qn12 of the other differential input stage DA1 are supplied to switches Sw13, Sw23, Sw24, and Sw14 of the shared driving amplification stage/output amplification stage DR&Out and sources of the grounded-gate PMOS amplification transistors Qp3 and Qp4 via the on-state switch AN1_Sw. At this time, the switches Sw13, Sw14, Sw11, and Sw12 on the outside are controlled in the on state, and the switches Sw23, Sw24, Sw21, and Sw22 on the inside are controlled in the off state. In the selecting operation Smp at this time, the analog input signal of the 1-channel AN1 is supplied to the first input terminal In1 in the other differential input stage DA1 functioning as the non-inverting input terminal + of the operational amplifier OpAmp0 via the switch SW11. In the counting operation T3 of the third time, the output terminal Out1 of the operational amplifier OpAmp0 is coupled to the second input terminal In2 in the other differential input stage DA1 functioning as the inverting input terminal − of the operational amplifier OpAmp0 via the switch SW07. In the first half of the counting operation T3 of the third time, the output terminal Out1 of the operational amplifier OpAmp0 is coupled to the sampling capacitor C1 of the input of the comparator Comp of the 10-bit successive-approximation type A/D converter via the switch SW3. In the latter half of the counting operation T3 of the third time, the analog input signal of the 1-channel AN1 is coupled to the sampling capacitor C1 of the input of the comparator Comp of the 10-bit successive-approximation type A/D converter via the switches SW15 and SW3.

A counting operation T4 of the fourth time shown in FIG. 17 is an A/D converting operation ADC for converting an analog input signal voltage sampled by the operation Smp of selecting the analog input signal of the 1-channel AN1 as the counting operation T3 of the third time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation T5 of the fifth time shown in FIG. 17 is the operation Smp of selecting the analog input signal of the zero channel AN0 of the multiplexer MPX. Drain signals of differential NMOS transistors Qn01 and Qn02 of the differential input stage DA0 are supplied to switches Sw13, Sw23, Sw24, and Sw14 of the shared driving amplification stage/output amplification stage DR&Out and sources of the grounded-gate PMOS amplification transistors Qp3 and Qp4 via the on-state switch AN0_Sw. At this time, the switches Sw13, Sw14, Sw11, and Sw12 on the outside are controlled in the off state, and the switches Sw23, Sw24, Sw21, and Sw22 on the inside are controlled in the on state. In the selecting operation Smp at this time, the analog input signal of the zero channel AN0 is supplied to the second input terminal In2 in the differential input stage DA0 functioning as the non-inverting input terminal + of the operational amplifier OpAmp0 via the switch SW02. In the counting operation T5 of the fifth time, the output terminal Out1 of the operational amplifier OpAmp0 is coupled to the first input terminal In1 of the differential input stage DA0 functioning as the inverting input terminal − of the operational amplifier OpAmp0 via the switch SW04. In the first half of the counting operation T5 of the fifth time, the output terminal Out1 of the operational amplifier OpAmp0 is coupled to the sampling capacitor C1 of the input of the comparator Comp of the 10-bit successive-approximation type A/D converter via the switch SW3. In the latter half of the counting operation T5 of the fifth time, the analog input signal of the zero channel AN0 bypasses the operational amplifier OpAmp0 and is coupled to the sampling capacitor C1 of the input of the comparator Comp of the 10-bit successive-approximation type A/D converter via the switches SW06 and SW3.

A counting operation T6 of the sixth time shown in FIG. 17 is an A/D converting operation ADC for converting an analog input signal voltage sampled by the operation Smp of selecting the analog input signal of the zero channel as the counting operation T5 of the fifth time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

A counting operation T7 of the seventh time is the operation Smp of selecting the analog input signal of the 1-channel AN1 of the multiplexer MPX. Drain signals of differential NMOS transistors Qn11 and Qn12 of the other differential input stage DA1 are supplied to switches Sw13, Sw23, Sw24, and Sw14 of the shared driving amplification stage/output amplification stage DR&Out and sources of the grounded-gate PMOS amplification transistors Qp3 and Qp4 via the on-state switch AN1_Sw. At this time, the switches Sw13, Sw14, Sw11, and Sw12 on the outside are controlled in the off state, and the switches Sw23, Sw24, Sw21, and Sw22 on the inside are controlled in the on state. In the selecting operation Smp at this time, the analog input signal of the 1-channel AN1 is supplied to the second input terminal In2 of the other differential input stage DA1 functioning as the non-inverting input terminal + of the operational amplifier OpAmp0 via the switch SW12. In the counting operation T7 of the seventh time, the output terminal Out1 of the operational amplifier OpAmp0 is coupled to the first input terminal In1 of the other differential input stage DA1 functioning as the inverting input terminal − of the operational amplifier OpAmp0 via the switch SW03. In the first half of the counting operation T7 of the seventh time, the output terminal Out1 of the operational amplifier OpAmp0 is coupled to the sampling capacitor C1 of the input of the comparator Comp of the 10-bit successive-approximation type A/D converter via the switch SW3. In the latter half of the counting operation T7 of the seventh time, the analog input signal of the 1-channel AN1 bypasses the operational amplifier OpAmp0 and is coupled to the sampling capacitor C1 of the input of the comparator Comp of the 10-bit successive-approximation type A/D converter via the switches SW15 and SW3.

A counting operation T8 of the eighth time shown in FIG. 17 is an A/D converting operation ADC for converting an analog input signal voltage sampled by the operation Smp of selecting the analog input signal of the 1-channel AN1 as the counting operation T7 of the seventh time to a digital signal. The A/D converting operation ADC is executed by supplying the reference voltage $V_{REF1}$ via the switch SW3 to the sampling capacitor C1 of the input of the comparator Comp of the 10-bit successive-approximation A/D converter of FIG. 5 as described above.

The present invention achieved by the inventors of the present invention has been concretely described on the basis of the embodiments. Obviously, the present invention is not limited to the embodiments but may be variously modified without departing from the gist.

For example, the A/D converter is not limited to the successive-approximation A/D converter but may be, for example, an ultrahigh-speed flash-type A/D converter. As well known, the flash A/D converter compares analog voltage of the output ADCOM of the multiplexer MPX with a plurality of reference voltages of different voltage levels by a plurality of voltage comparators and generates a digital signal from an encoder coupled to the voltage comparators.

The A/D converter is not limited to a flash-type A/D converter but may be, as described below, an oversampling-type ΣΔ A/D converter or a pipeline-type A/D converter. <<Oversampling-type ΔΣ A/D Converter>>

FIG. 18 is a diagram showing a secondary oversampling-type ΔΣ A/D converter 9 as another embodiment of the present invention.

In FIG. 18, an analog input signal Vin of the output ADCOM of the multiplexer MPX shown in FIG. 5 is supplied to one of input terminals of a resonator 92 as a first analog integrator, and an output signal of a D/A converter 99 is supplied to the other input terminal of the resonator 92. The resonator 92 is configured by an adder 921 and two delay circuits 922 and 923. An input signal Vin is supplied to one of the input terminals of the adder 921, and a signal obtained by multiplying an output signal of the delay circuit 923 with −1 is supplied to the other input terminal of the adder 921. A signal obtained by multiplying an output signal of the D/A converter 99 with −1 is supplied to further another input terminal of the adder 921.

An output signal of the resonator 92 from the output of the delay circuit 922 is supplied to one input terminal of a resonator 94 as a second analog integrator, and an output signal of a D/A converter 96 is supplied to the other input terminal of the resonator 94. The resonator 94 is configured by an adder 941 and two delay circuits 942 and 943. An output signal of the resonator 92 as a first analog integrator is supplied to one of input terminals of the adder 941. A signal obtained by multiplying an output signal of the delay circuit 943 with −1 is supplied to the other input terminal of the adder 941. A signal obtained by doubling an output signal of the D/A converter 96 is supplied to further another input terminal of the adder 941.

An output signal of the resonator 94 from the output of the delay circuit 942 of the resonator 94 as a second analog integrator is supplied to an input terminal of a quantizer 95. From an output of the quantizer 95, a digital output signal Vout is generated. Another digital output signal of the quantizer 95 is transmitted to the local D/A converter 96 and a delay circuit 98. An output signal of the delay circuit 98 is inversely converted to an analog feedback signal by the local D/A converter 99. Analog feedback signals from the local D/A converters 96 and 99 are fed back to feedback input terminals of the resonators 92 and 94. A digital output signal Vout from the output of the quantizer 95 is a digital output signal having a dilatational wave pulse waveform corresponding to the signal level of the analog input signal Vin.

<<Pipeline A/D Converter Capable of Performing Interleaving Operation>>

FIG. 19 is a diagram showing a pipeline A/D converter capable of performing interleaving operation as further another embodiment of the present invention. The pipeline A/D converter is configured by a plurality of A/D conversion stages 1, 2, . . . , j, and (j+1) which are cascaded and an encoder ENC.

Each of the first A/D conversion stage 1 and the last A/D conversion stage (j+1) has a resolution of three bits, and each of the other intermediate A/D conversion stages 2, . . . and j has a resolution of 1.5 bits. To the first A/D conversion stage 1, the analog input signal Vin of the output ADCOM of the multiplexer MPX shown in FIG. 5 is supplied. The first A/D conversion stage 1 includes a sub A/D converter 10 to which the analog input signal Vi is supplied, a sub D/A converter 11 to which signals d0, d1, and d2 from the sub A/D converter 10 are supplied, a switched capacitor circuit 12 (Scod and Scev) and a differential amplifier 13 (AMP). With the configuration, a residual signal Vres from the differential amplifier 13 (AMP) to the next A/D conversion stage 2 is generated.

FIG. 19 also shows the configuration of the first A/D conversion stage 1 and the second A/D conversion stage 2.

The analog input signal Vi of the first stage 1 is coarsely quantized by the sub A/D converter 10. From a digital signal of the sub A/D converter 10, quantized analog voltage is generated by the sub D/A converter 11. The quantized analog voltage is subtracted from the original analog input signal Vi by an adder of the switched capacitor circuit 12, thereby generating a quantized analog error. To generate an interstage residual signal Vres of the analog signal, the quantized analog error is amplified by the amplifier 13 (AMP), and the quantized analog error is recovered to a full-scale range. In particular, the switched capacitor circuit 12 of the first A/D conversion stage 1 includes a first switched capacitor circuit Scod and a second switched capacitor circuit Scev. Therefore, the first switched capacitor circuit Scod performs a sampling operation of odd-numbered pipeline periods in the pipelines and a holding operation of even-numbered pipeline periods. The second switched capacitor circuit Scev performs the sampling operation of even-numbered pipeline periods in the pipelines and a holding operation of odd-numbered pipeline periods. In such a manner, higher precision of the A/D conversion in the first stage and lower power consumption can be realized.

The second A/D conversion stage 2 includes a 1.5-bit sub A/D converter 20, a 1.5-bit sub D/A converter 21, a switched capacitor circuit 22 having therein an adder, and an amplifier 23 (AMP). The interstage residual signal Vres of the analog signal from the first A/D conversion stage 1 is supplied to the 1.5-bit sub A/D converter 20, thereby generating a 1.5-bit digital signal supplied to the encoder 100 (ENC) and the next stage. By supplying the 1.5-bit digital signal from the first A/D conversion stage 1 to the 1.5-bit sub D/A converter 21, a quantized analog voltage is generated. The quantized analog voltage is subtracted from the interstage residual signal Vres of the analog signal from the first stage 1 by the adder of the switched capacitor circuit 22, thereby generating a quantized analog error. To generate the interstage residual signal Vres of the analog signal, the quantized analog error is amplified by the amplifier 23 (AMP), and the quantized analog error is recovered to a full-scale range. The 1.5-bit digital signal from the 1.5-bit sub A/D converter 20 in the second A/D conversion stage 2 and the interstage residual signal Vres of the analog signal from the amplifier 23 (AMP) are supplied to the third A/D conversion stage 3. Similarly, the 1.5-bit digital signal and the interstage residual signal Vres are transmitted sequentially through the stages to the final A/D conversion stage (j+1) The switched capacitor circuit 22 in the second A/D conversion stage 2 includes the first switched capacitor circuit Scod and the second switched capacitor circuit Scev. Therefore, the first switched capacitor circuit Scod performs the sampling operation in the odd-numbered pipeline periods of the pipelines and the holding operation in the even-numbered pipeline periods. The second switched capacitor circuit Scev performs the sampling operation of the even-numbered pipeline periods of the pipelines and the holding operation of the odd-numbered pipeline periods. In such a manner, higher precision of the A/D conversion in the second stage and lower power consumption can be realized.

The present invention can be applied not only to a microcomputer mounted on a vehicle but also to an ultrahigh-speed A/D converter of a wideband wireless communication LSI. A reception mixer of an RF receiving circuit down-converts the reception RF signal by a reception mixer of the RF reception circuit to a reception analog baseband signal of a higher bit rate, holds a reception analog baseband signal by the sample and hold circuit to which the present invention is applied, and holds it constant. By the ultrahigh-speed A/D converter to which the present invention is applied, a reception analog baseband signal held constant by the sample and hold circuit is converted to a reception digital baseband signal. The reception digital baseband signal is processed by software process in a digital signal processor (DSP), a demodulated signal can be generated. By employing the sample and hold circuit to which the present invention is applied, the offset error voltage at the output signal impedance of a reception mixer in an RF reception circuit due to the influence of the input offset voltage of the operational amplifier in the sample and hold circuit can be reduced. As a result, signal precision of the LSI for high-bit-rate wideband wireless communication can be improved.

What is claimed is:

1. A semiconductor integrated circuit comprising an A/D converter and a sampling circuit coupled to an input terminal of the A/D converter, wherein the sampling circuit includes an analog input terminal, an operational amplifier, a first switch, a second switch, a third switch, a fourth switch, a fifth switch, and an analog output terminal, wherein the analog input terminal is coupled to one end of the first switch and one end of the second switch, the other end of the first switch and the other end of the second switch are coupled to first and second input terminals, respectively, of the operational amplifier, wherein one end and the other end of the third switch are coupled to the first input terminal of the operational amplifier and an output terminal of the operational amplifier, respectively, one end and the other end of the fourth switch are coupled to the first input terminal of the operational amplifier and the output terminal of the operational amplifier, respectively, wherein an output terminal of the operational amplifier is coupled to an input terminal of the A/D converter via the analog output terminal, wherein one end and the other end of the fifth switch are coupled to the analog input terminal and the analog output terminal, respectively, so as to bypass the operational amplifier, wherein the sampling circuit samples an analog input signal supplied to the analog input terminal in first and second sample modes, wherein the A/D converter converts an analog signal sampled by the sampling circuit in the first or second sample mode to a digital signal in a conversion mode after the first or second sample mode, wherein in a first half of the first sample mode of the sampling circuit, the first and fourth switches are controlled in an on state and, on the other hand, the second, third, and fifth switches are controlled in an off state, wherein in the first half of the first sample mode of the sampling circuit, an internal circuit of the operational amplifier is controlled so that the first and second input terminals of the operation amplifier function as a non-inverting input terminal and an inverting input terminal of the operational amplifier, respectively, wherein in a latter half of the first sample mode of the sampling circuit, driving of the analog output terminal by the operational amplifier is stopped and, on the other hand, the fifth switch is controlled in the on state, wherein in the latter half of the first sample mode of the sampling circuit, the analog input signal supplied to the analog input terminal is transmitted to the input terminal of the A/D converter via the fifth switch and the analog output terminal, wherein in the first half of the second sample mode of the sampling circuit, the first, fourth, and fifth switches are controlled in an off state and, on the other hand, the second and third switches are controlled in an on state, wherein in the first half of the second sample mode of the sampling circuit, the internal circuit of the operational amplifier is controlled so that the first and second input terminals of the operational amplifier function as an inverting input terminal and a non-inverting input terminal of the operational amplifier, respectively, wherein in the latter half of the second sample mode of the sampling circuit, driving of the analog output terminal by the operational amplifier is stopped and, on the other hand, the fifth switch is controlled in the on state, and wherein in the latter half of the second sample mode of the sampling circuit, the analog input signal supplied to the analog input terminal is transmitted to the input terminal of the A/D converter via the fifth switch and the analog output terminal.

2. The semiconductor integrated circuit according to claim 1, wherein the first and second sample modes are repeated a plurality of times.

3. The semiconductor integrated circuit according to claim 2, wherein in the operational amplifier, a differential transistor in a differential input stage and a cascaded current mirror load transistor in a drive amplifier stage are transistors of a first conduction type, and wherein the drive amplification stage includes a grounded-gate transistor pair of a second conduction type which is opposite to the first conduction type, and a differential output signal of the differential transistor is supplied to the current mirror load transistor via the grounded-gate transistor pair in the drive amplification stage, thereby configuring the operational amplifier as a folded cascade operational amplifier.

4. The semiconductor integrated circuit according to claim 2, wherein the operational amplifier includes a rail-to-rail differential input stage including a first differential transistor of a first conduction type and a second differential transistor of a second conduction type opposite to the first conduction type.

5. The semiconductor integrated circuit according to claim 4, wherein the differential input stage includes a conductance control circuit for reducing fluctuations in mutual conductance of the differential input stage due to fluctuations in a differential input common mode voltage.

6. The semiconductor integrated circuit according to claim 2, wherein the A/D converter is any of a successive-approximation type A/D converter, a flash-type A/D converter, a ΣΔ type A/D converter, and a pipeline-type A/D converter.

7. The semiconductor integrated circuit according to claim 6, wherein the digital signal converted by the A/D converter is supplied to a central processing unit (CPU).

8. The semiconductor integrated circuit according to claim 7, wherein the operational amplifier is a CMOS analog operational amplifier, and each of the first, second, third, fourth, and fifth switches is configured by a CMOS analog switch.

9. A semiconductor integrated circuit comprising an A/D converter and a multiplexer coupled to an input terminal of the A/D converter, wherein the multiplexer includes a plurality of analog input terminals, an analog output terminal, and a plurality of channels between the analog input terminals and the analog output terminal, wherein each of the channels in the multiplexer includes an operational amplifier, a first switch, a second switch, a third switch, a fourth switch, a fifth switch, and an analog output terminal, wherein in each of the channels in the multiplexer, each of the analog input terminals is coupled to one end of each of the first switches and one end of each of the second switches, the other end of the first switch and the other end of the second switch are coupled to first and second input terminals of each of the operational amplifiers, respectively, wherein in each of the channels in the multiplexer, one end and the other end of each of the third switches are coupled to the first input terminal of each of the operational amplifiers and an output terminal of the operational amplifier, respectively, one end and the other end of each of the fourth switches are coupled the first input terminal of the operational amplifier and the output terminal of the operational amplifier, respectively, wherein in each of the channels in the multiplexer, an output terminal of each of the operational amplifiers is coupled to the input terminal of the A/D converter via the analog output terminal, wherein in each of the channels in the multiplexer, one end and the other end of each of the fifth switches are coupled to each of the analog input terminals and the analog output terminal so as to bypass each of the operational amplifiers, wherein the multiplexer samples an analog input signal supplied to an arbitrary analog input terminal selected from the analog input terminals in first and second sample modes, wherein the A/D converter converts an analog signal sampled by the multiplexer in the first or second sample mode to a digital signal in a conversion mode after the first or second sample mode, wherein in a first half of the first sample mode of the multiplexer, the first and fourth switches are controlled in an on state and, on the other hand, the second, third, and fifth switches are controlled in an off state, wherein in the first half of the first sample mode of the multiplexer, an internal circuit of the operational amplifier is controlled so that the first and second input terminals of the operational amplifier function as a non-inverting input terminal and an inverting input terminal of the operational amplifier, respectively, wherein in a latter half of the first sample mode of the multiplexer, driving of the analog output terminal by the operational amplifier is stopped and, on the other hand, the fifth switch is controlled in the on state, wherein in the latter half of the first sample mode of the multiplexer, the analog input signal supplied to the analog input terminal is transmitted to the input terminal of the A/D converter via the fifth switch and the analog output terminal, wherein in the first half of the second sample mode of the multiplexer, the first, fourth, and fifth switches are controlled in an off state and, on the other hand, the second and third switches are controlled in an on state, wherein in the first half of the second sample mode of the multiplexer, the internal circuit of the operational amplifier is controlled so that the first and second input terminals of the operational amplifier function as an inverting input terminal and a non-inverting input terminal of the operational amplifier, respectively, wherein in the latter half of the second sample mode of the multiplexer, driving of the analog output terminal by the operational amplifier is stopped and, on the other hand, the fifth switch is controlled in the on state, and wherein in the latter half of the second sample mode of the multiplexer, the analog input signal supplied to the analog input terminal is transmitted to the input terminal of the A/D converter via the fifth switch and the analog output terminal.

10. The semiconductor integrated circuit according to claim 9, wherein the first and second sample modes are repeated a plurality of times.

11. The semiconductor integrated circuit according to claim 10, wherein in the operational amplifier, a differential transistor in a differential input stage and a cascaded current mirror load transistor in a drive amplifier stage are transistors of a first conduction type, and wherein the drive amplification stage includes a grounded-gate transistor pair of a second conduction type which is opposite to the first conduction type, and a differential output signal of the differential transistor is supplied to the current mirror load transistor via the grounded-gate transistor pair in the drive amplification stage, thereby configuring the operational amplifier as a folded cascade operational amplifier.

12. The semiconductor integrated circuit according to claim 10, wherein the operational amplifier includes a rail-to-rail differential input stage including a first differential transistor of a first conduction type and a second differential transistor of a second conduction type opposite to the first conduction type.

13. The semiconductor integrated circuit according to claim 12, wherein the differential input stage includes a conductance control circuit for reducing fluctuations in mutual conductance of the differential input stage due to fluctuations in a differential input common-mode voltage.

14. The semiconductor integrated circuit according to claim 10, wherein two adjacent channels in the channels in the multiplexer share a single operational amplifier.

15. The semiconductor integrated circuit according to claim 14, wherein each of two adjacent channels in the channels in the multiplexer includes a differential amplification stage of a dedicated operational amplifier, and the two adjacent channels share a single drive amplification stage and output amplification stage of an operational amplifier to which a signal from the differential amplification stage is supplied.

16. The semiconductor integrated circuit according to claim 10, wherein the A/D converter is any of a successive-approximation type A/D converter, a flash-type A/D converter, a ΣΔ type A/D converter, and a pipeline-type A/D converter.

17. The semiconductor integrated circuit according to claim 16, wherein the digital signal converted by the A/D converter is supplied to a central processing unit (CPU).

18. The semiconductor integrated circuit according to claim 17, wherein the operational amplifier is a CMOS analog operational amplifier, and each of the first, second, third, fourth, and fifth switches is configured by a CMOS analog switch.

* * * * *